United States Patent
Jung et al.

(10) Patent No.: US 7,539,970 B2
(45) Date of Patent: May 26, 2009

(54) METHOD OF MANUFACTURING MASK

(75) Inventors: Sung-Gon Jung, Seoul (KR); Gi-Sung Yeo, Seoul (KR); Young-Mi Lee, Seoul (KR); Han-Ku Cho, Seongnam-si (KR)

(73) Assignee: Samsung Electronics Co., Ltd., Suwon-Si (KR)

( * ) Notice: Subject to any disclaimer, the term of this patent is extended or adjusted under 35 U.S.C. 154(b) by 290 days.

(21) Appl. No.: 11/590,244

(22) Filed: Oct. 31, 2006

(65) Prior Publication Data

US 2008/0097729 A1    Apr. 24, 2008

(30) Foreign Application Priority Data

Oct. 9, 2006    (KR) .................. 10-2006-0097972

(51) Int. Cl.
  *G06F 17/50* (2006.01)
  *G06F 19/00* (2006.01)
  *G03F 1/00* (2006.01)
  *G21K 5/00* (2006.01)

(52) U.S. Cl. .................. 716/21; 700/120; 700/121; 430/5; 378/35

(58) Field of Classification Search .................. 716/21; 700/120, 121; 430/5; 378/35
See application file for complete search history.

(56) References Cited

U.S. PATENT DOCUMENTS

| | | | |
|---|---|---|---|
| 7,073,163 B2* | 7/2006 | Kashimoto et al. ............ 716/21 |
| 2002/0062206 A1* | 5/2002 | Liebchen ...................... 703/6 |
| 2004/0049760 A1* | 3/2004 | Garza et al. ................... 716/19 |
| 2004/0088675 A1* | 5/2004 | Nakano et al. ................ 716/21 |
| 2004/0158809 A1* | 8/2004 | Kashimoto et al. ............ 716/21 |
| 2005/0147896 A1* | 7/2005 | Hoshino ........................ 430/5 |
| 2005/0204327 A1* | 9/2005 | Mukai et al. .................. 716/19 |
| 2006/0110025 A1* | 5/2006 | Ho et al. ....................... 382/144 |
| 2006/0115751 A1* | 6/2006 | Fay et al. ...................... 430/22 |
| 2007/0061773 A1* | 3/2007 | Ye et al. ........................ 716/21 |
| 2007/0162889 A1* | 7/2007 | Broeke et al. ................. 716/21 |
| 2008/0010628 A1* | 1/2008 | Jung et al. .................... 716/19 |
| 2008/0066047 A1* | 3/2008 | Heng et al. .................... 716/21 |
| 2008/0072207 A1* | 3/2008 | Verma et al. .................. 716/21 |
| 2008/0212869 A1* | 9/2008 | Yoshikawa et al. ........... 382/144 |
| 2008/0301624 A1* | 12/2008 | Heng et al. .................... 716/21 |

FOREIGN PATENT DOCUMENTS

| | | |
|---|---|---|
| JP | 11184064 | 7/1999 |
| JP | 2005-316134 | 11/2005 |
| KR | 1020030007951 | 1/2003 |
| KR | 1020030014427 | 2/2003 |
| KR | 10-2003-0074361 | 9/2003 |
| KR | 10-2006-0048140 | 5/2006 |

* cited by examiner

*Primary Examiner*—Phallaka Kik
(74) *Attorney, Agent, or Firm*—F.Chau & Associates, LLC

(57) ABSTRACT

A method of manufacturing a mask includes designing a second mask data pattern for forming a first mask data pattern, creating a first emulation pattern, which is determined from the second mask data pattern, using a first emulation, creating a second emulation pattern, which is determined from the first emulation pattern, using a second emulation, comparing a pattern, in which the first and second emulation patterns overlap, with the first mask data pattern, and manufacturing a mask layer, which corresponds to the second mask data pattern, according to results of the comparison.

32 Claims, 22 Drawing Sheets

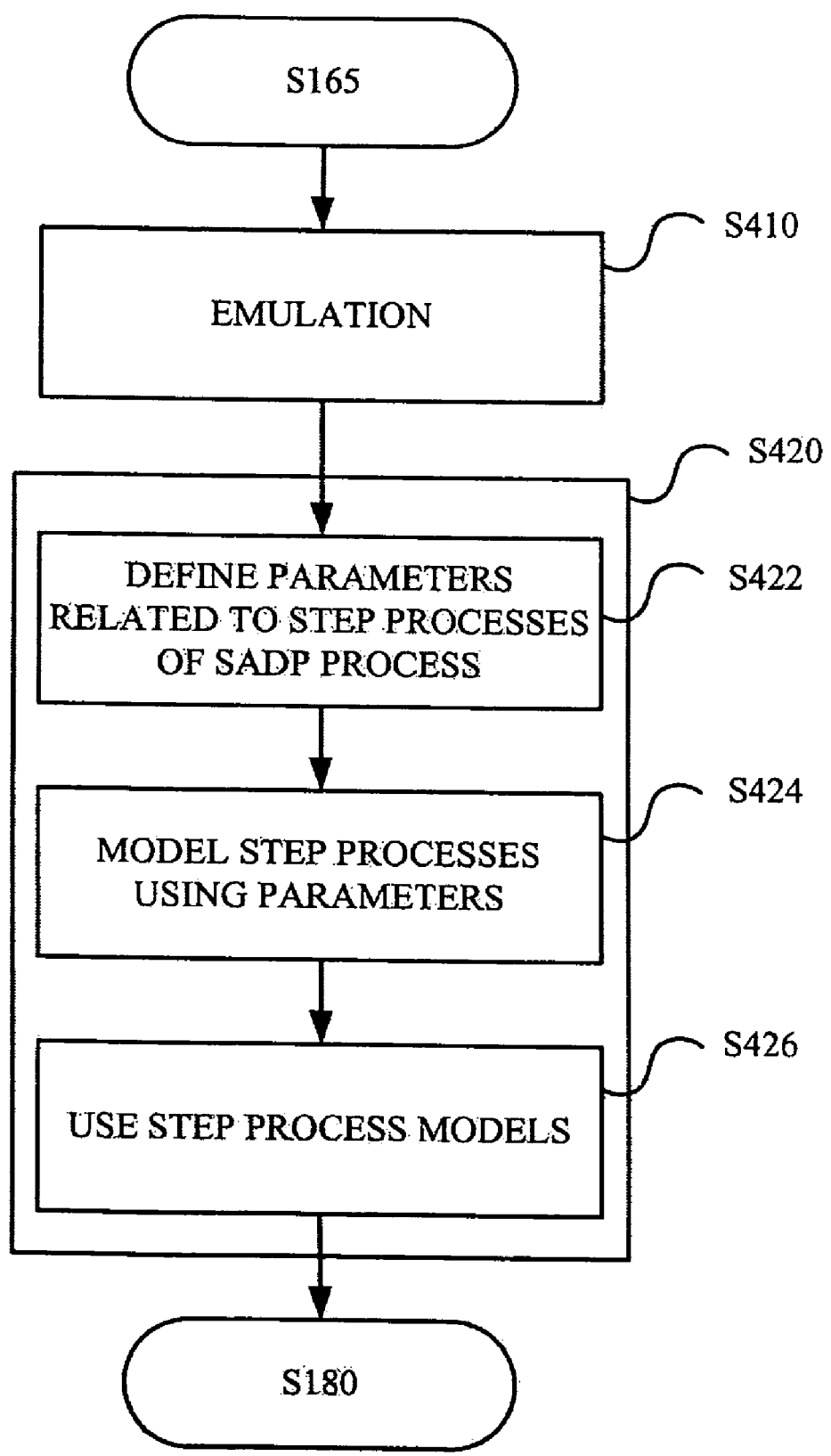

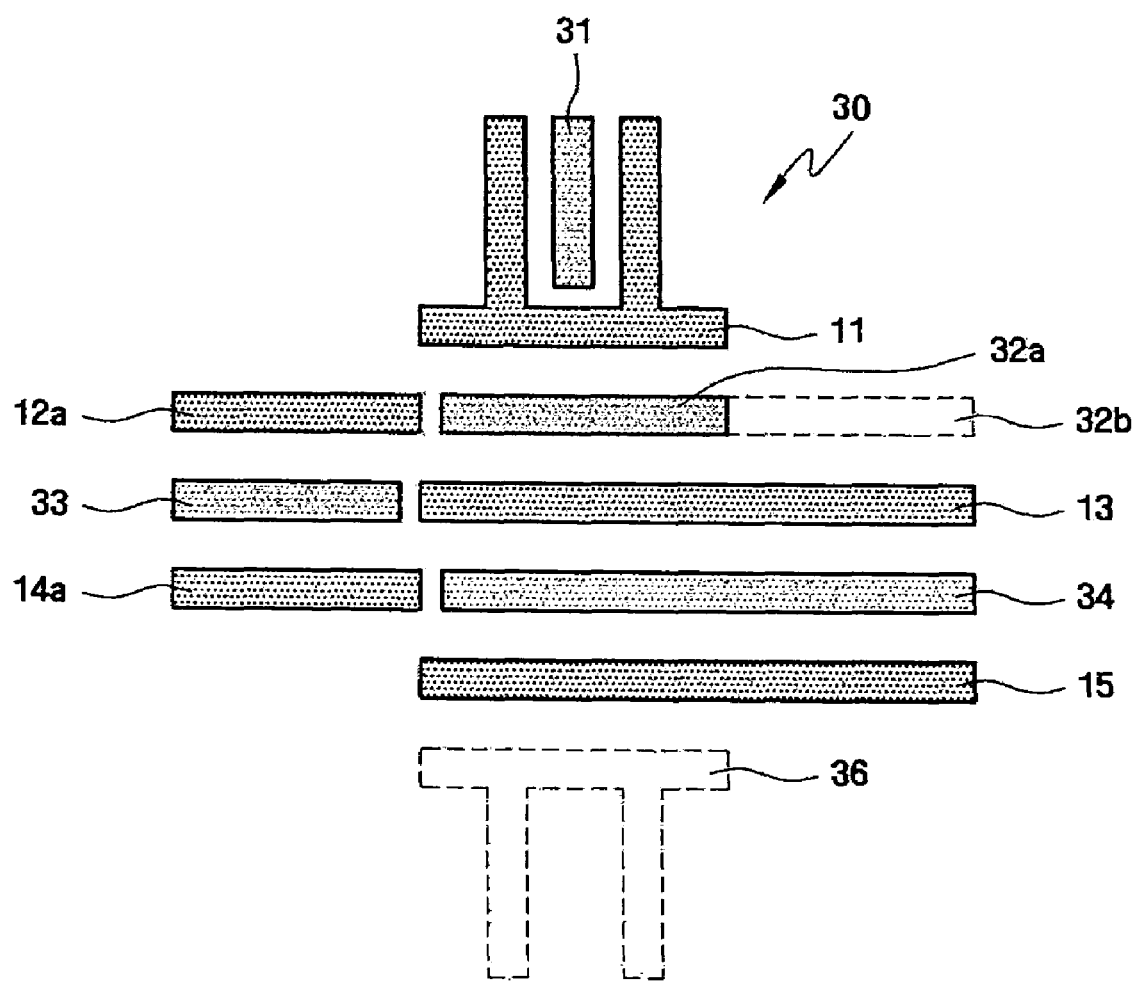

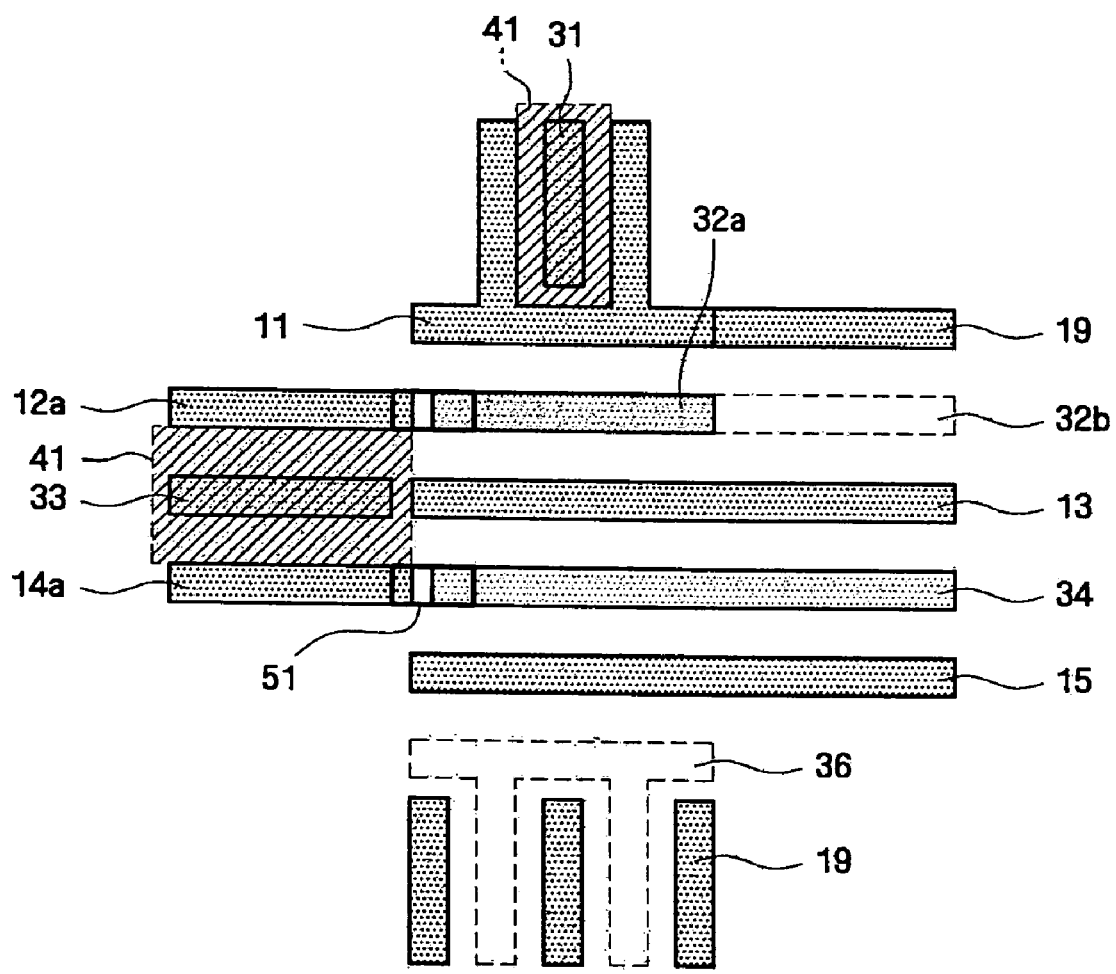

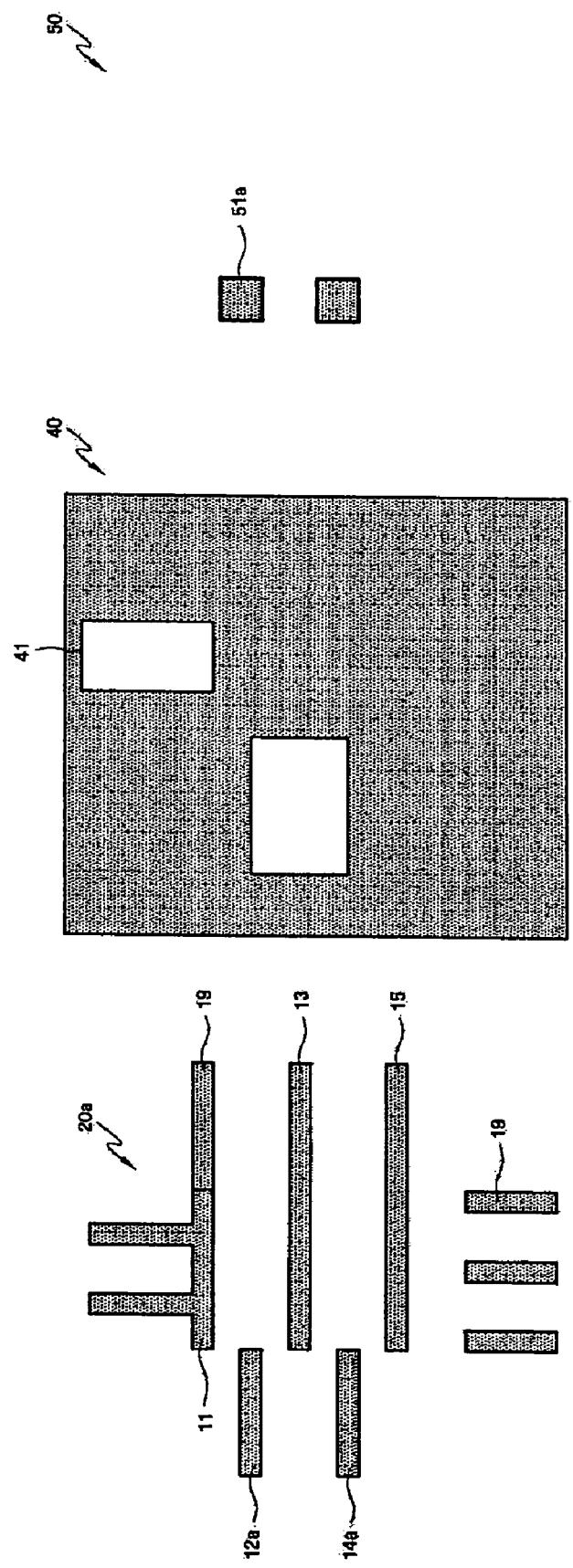

METHOD OF MANUFACTURING MASK

CROSS-REFERENCE TO RELATED APPLICATION

This application claims priority from Korean Patent Application No. 10-2006-0097972 filed on Oct. 9, 2006, the disclosure of which is incorporated herein by reference in its entirety.

BACKGROUND OF THE INVENTION

1. Technical Field

The present disclosure relates to a method of manufacturing a mask, and more particularly, to a method of manufacturing a mask for forming a pattern on a wafer using a self-aligning double patterning process.

2. Discussion of the Related Art

A Self-Aligning Double Patterning (SADP) method is used to form a pitch smaller than a minimum pitch that can be formed using exposure equipment.

In the SADP method, a mask data pattern is designed using a first pitch which can be formed using exposure equipment, and a first hard mask layer pattern is formed using a mask layer that corresponds to the mask data pattern. Thereafter, a sacrificial layer and a second hard mask layer are formed on the first hard mask layer pattern, and a hard mask layer pattern having a second pitch less than the first pitch is formed through a planarization process and an anisotropic etching process. Using the above SADP method, a pitch, which is less than the minimum pitch that can be formed using exposure equipment, can be formed so that fine patterns that facilitate high integration can be formed.

SUMMARY OF THE INVENTION

According to an exemplary embodiment of the present invention, a method of manufacturing a mask includes designing a second mask data pattern for forming a first mask data pattern, creating a first emulation pattern, which is determined from the second mask data pattern, using a first emulation, creating a second emulation patter, which is determined from the first emulation pattern, using a second emulation, comparing a pattern, in which the first and second emulation patterns overlap, with the first mask data pattern, and manufacturing a mask layer, which corresponds to the second mask data pattern, according to the results of the comparison.

According to an exemplary embodiment of the present invention, a method of manufacturing a mask includes designing a first mask data pattern, designing a second mask data pattern for forming the first mask data pattern, creating a first emulation pattern, which is determined from the second mask data pattern, using a layout-based SADP emulation, comparing the first emulation pattern with the first mask data pattern, modifying the second mask data pattern according to the results of the comparison, performing an Optical Proximity Correction (OPC) on the modified second mask data pattern, creating a second emulation pattern, which is determined from the second mask data pattern, on which the OPC has been performed, using an image-based emulation, creating a third emulation pattern, which is determined from the second emulation pattern, using the image-based SADP emulation, comparing a pattern, in which the second and third emulation patterns overlap, with the first mask data pattern, and manufacturing a first mask layer, which corresponds to the second mask data pattern, according to the results of the comparison.

According to an exemplary embodiment of the present invention, a method of manufacturing a mask includes designing a first mask data pattern, designing a second mask data pattern for forming the first mask data pattern, creating a first emulation pattern, which is determined from the second mask data pattern, using a layout-based SADP emulation, comparing the first emulation pattern with the first mask data pattern, designing third mask data patterns, which are used to create partial patterns that are not formed using the second mask data pattern, according to the results of the comparison, performing OPC on the second and third mask data patterns, creating a second emulation pattern, which is determined from the second mask data pattern on which the OPC has been performed, using an image-based SADP emulation, creating a third emulation pattern, which is determined from the second emulation pattern, using the image-based SADP emulation, creating a fourth emulation pattern, which is determined from the third mask data patterns on which the OPC has been performed, using the image-based SADP emulation, comparing a pattern, in which the second to fourth emulation patterns overlap, with the first mask data pattern, and manufacturing first and second mask layers, which respectively correspond to the second and third mask data patterns, according to the results of the comparison.

According to an exemplary embodiment of the present invention, a method of manufacturing a mask includes defining one or more parameters related to respective step processes of an SADP process, modeling each of the step processes using the parameters, and creating a second emulation pattern by applying step process models to a first emulation pattern.

BRIEF DESCRIPTION OF THE DRAWINGS

Exemplary embodiments of the present invention can be understood in more detail from the following description taken in conjunction with the accompanying drawings, in which:

FIG. 2 is a flowchart illustrating an image-based SADP emulation according to an exemplary embodiment of the present invention;

FIGS. 3A to 3K are diagrams for illustrating a method of manufacturing a mask according to an exemplary embodiment of the present invention;

DESCRIPTION OF EXEMPLARY EMBODIMENTS

Exemplary embodiments of the present invention will be described below in more detail with reference to the accompanying drawings. The present invention may be embodied in many different forms and should not be construed as limited to the embodiments set forth herein.

Figure 1:
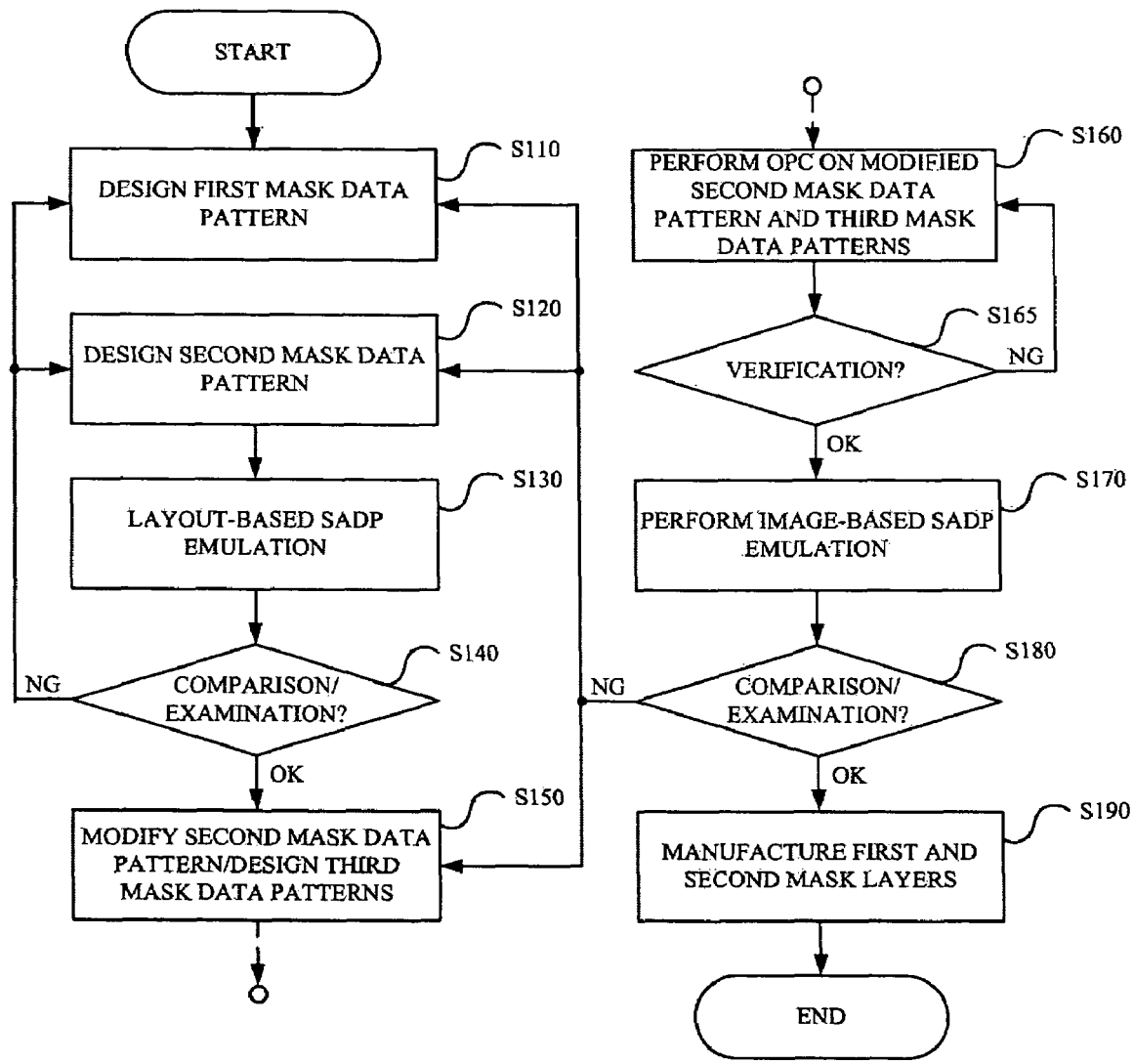
FIG. 1 is a flowchart for illustrating a method of manufacturing a mask according to an exemplary embodiment of the present invention.

FIG. 1 is a flowchart for illustrating a method of manufacturing a mask according to an exemplary embodiment of the present invention. FIG. 2 is a flowchart illustrating an image-based SADP emulation of FIG. 1 according to an exemplary embodiment of the present invention. FIGS. 3A to 3K are diagrams for illustrating the method of manufacturing a mask according to an exemplary embodiment of the present invention.

Figure 3A:
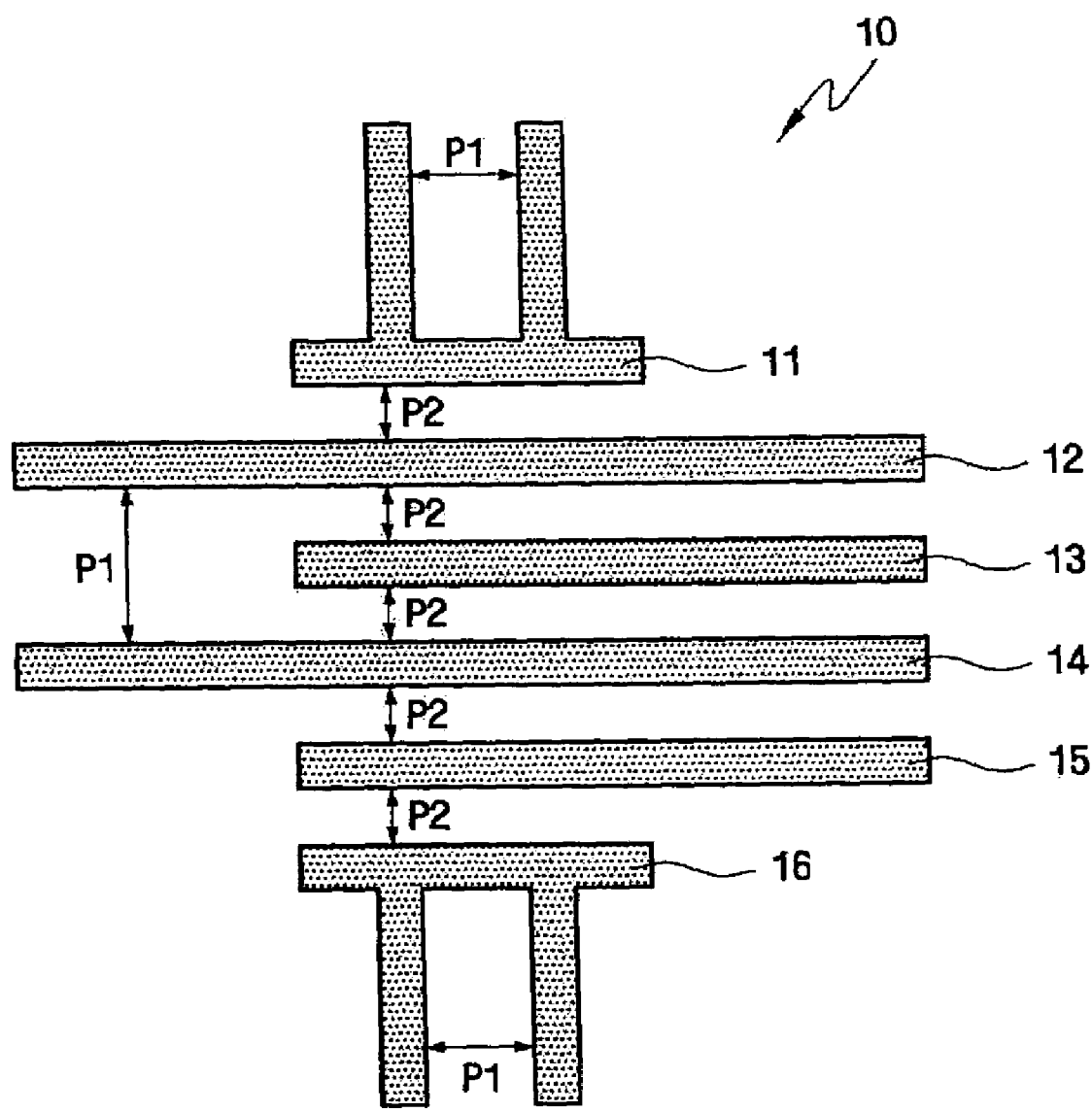

With reference to FIGS. 1 and 3A, a first mask data pattern 10 to be formed on a wafer is designed at step S110.

The first mask data pattern 10 may include a plurality of patterns 11 to 16. The pitch between each pair of neighboring patterns among patterns 11 to 16 may be a first pitch P1 or a second pitch P2. The first pitch P1 is a value that can be achieved using typical exposure equipment, and the second pitch P2 is a value less than the minimum pitch that can be achieved using the typical exposure equipment The pitch between two patterns, for example, the patterns 11 and 12, is referred to as the shortest distance from the edge of a pattern to the edge of another pattern, for example, from the edge of the pattern 11 to the edge of another pattern 12.

Figure 3B:
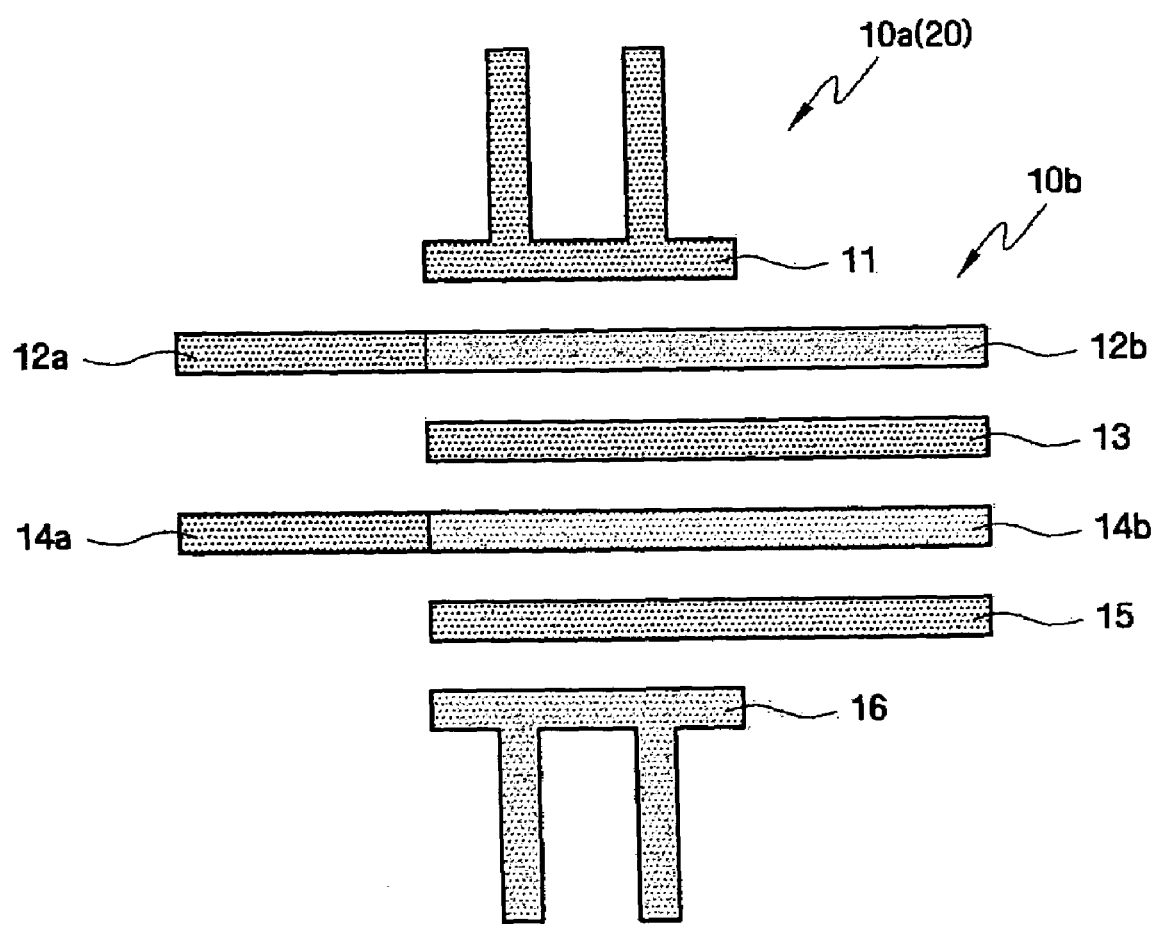

In FIGS. 1 and 3B, a second mask data pattern 20 for forming the first mask data pattern 10 using an SADP process is designed at step S120.

The first mask data pattern 10 includes a main pattern 10a (represented by a dark dot pattern) and a sub-pattern 10b (represented by a light dot pattern) according to a decomposition guide. The main pattern 10a may correspond to the second mask data pattern 20. The decomposition guide is a rule for the classification of the first mask data pattern 10 designed at a prior stage to perform the SADP process. An example of the decomposition guide may include the definition "when the pitch between two neighboring patterns is less than a predetermined pitch (for example, P1), one pattern is the main pattern 10a and another pattern is the sub-pattern 10b." As shown in FIG. 3B, when the pitch between each pair of neighboring patterns among the patterns 11 to 16 is the second pitch P2, patterns 11, 12a, 13, 14a and 15 may be the main pattern 10a, and patterns 12b, 14b and 16 may be the sub-pattern 10b. Using the decomposition guide as a method of designing the second mask data pattern 20 is an exemplary method.

With reference to FIGS. 1 and 3C, a first emulation pattern 30, which is determined from the second mask data pattern 20, is created using a layout-based SADP emulation at step S130. The layout-based SADP emulation is an exemplary method of examining whether the first mask data pattern 10 can be normally formed from the second mask data pattern 20.

In the layout-based SADP emulation, an emulation tool receives process conditions, such as pitches between patterns, the deposition thickness of a sacrificial layer, and the deposition thickness of a hard mask layer, and determines the first emulation pattern 30, which is formed from the second mask data pattern 20, using the above conditions. The sacrificial layer may comprise a silicon oxide layer, and the hard mask layer may comprise a polysilicon layer.

The emulation tool receives pitches between patterns without receiving the deposition thickness of a sacrificial layer or the deposition thickness of a hard mask layer. When the pitch between two neighboring patterns in the second mask data pattern 20 is less than a predetermined pitch (for example, P1), a new pattern is created between the two patterns, and thus the first emulation pattern 30 may be determined.

The layout-based SADP emulation may not use exposure conditions, such as the wavelength, dosage and energy of light. Process conditions used to perform the layout-based SADP emulation may not be used. The reason for this is because the layout-based SADP emulation is used to examine whether all of the patterns of the first mask data pattern 10 are normally formed using the second mask data pattern 20, but is not used to examine the detailed shapes of the patterns formed using the second mask data pattern 20. When it is found that all of the patterns of the first mask data pattern 10 are normally formed using the second mask data pattern 20 even though the exposure conditions are used, the exposure conditions may be used.

Thereafter, the first emulation pattern 30 and the first mask data pattern 10 are compared with each other at step S140.

Referring to FIG. 3C, in the first emulation pattern 30 formed using the layout-based SADP emulation, a pattern 31 is formed between the portions of the pattern 11, a pattern 33 is formed between the patterns 12a and 14a, a pattern 32a is formed between the patterns 11 and 13, and a pattern 34 is formed between the patterns 13 and 15.

When the first emulation pattern 30 and the first mask data pattern 10 are compared with each other, it can be seen that patterns 32b and 36, which must be formed, are not formed, and the patterns 31 and 33, which must not be formed, are formed. The pattern 12a and the pattern 14a must be respectively connected with the pattern 32a and the pattern 34, but the patterns are not connected.

Depending on the differences between the first emulation pattern 30 and the first mask data pattern 10, subsequent steps to be performed are changed. That is, the first mask data pattern 10 is redesigned at step S110 if it is determined that the first mask data pattern 10 has been erroneously designed at a prior stage. The second mask data pattern 20 is redesigned at step S120 if it is determined that the second mask data pattern 20 has been erroneously designed at a prior stage. The partial patterns of the second mask data pattern 20 are modified, or separate third mask data patterns 40 and 50 are designed if it is determined at step S150 that the differences between the first emulation pattern 30 and the first mask data pattern 10 are insignificant.

With reference to FIGS. 3D and 3E, the second mask data pattern 20 is modified and the separate third mask data patterns 40 and 50 are designed at step S150. FIG. 3D shows a modified second mask data pattern 20a and the newly designed third mask data patterns 40 and 50 overlapping each other. FIG. 3E shows the modified second mask data pattern 20a and the newly designed third mask data patterns 40 and 50 separately.

With reference to FIGS. 3D and 3E, the modification of adding the second mask data pattern 20 to dummy patterns 19 is performed to form the partial patterns 32b and 36 that were not formed in the first emulation pattern 30. The dummy patterns 19 are formed where the dummy patterns 19 do not cause a malfunction in the operation of the completed semiconductor device. Although the dummy patterns 19, may be formed to the second mask data pattern 20, the dummy patterns 19 may be designed in the form of separate third mask data patterns according to an exemplary embodiment of the present invention.

To remove the patterns 31 and 33 that must not be formed in the first emulation pattern 30, a third mask data pattern 40, including trimming patterns 41, is designed.

To respectively connect the partial patterns 12a and 14a of the first emulation pattern 30 with the partial patterns 32a and 34, the third mask data pattern 50, including connection patterns 51a, is designed.

A process of forming a first emulation pattern, which is determined from the modified second mask data pattern 20a and the newly designed third mask data patterns 40 and 50, using the layout-based SADP emulation, and remodifying the modified second mask data pattern 20a or modifying the newly designed third mask data patterns 40 and 50 may be repeated.

Figure 3F:
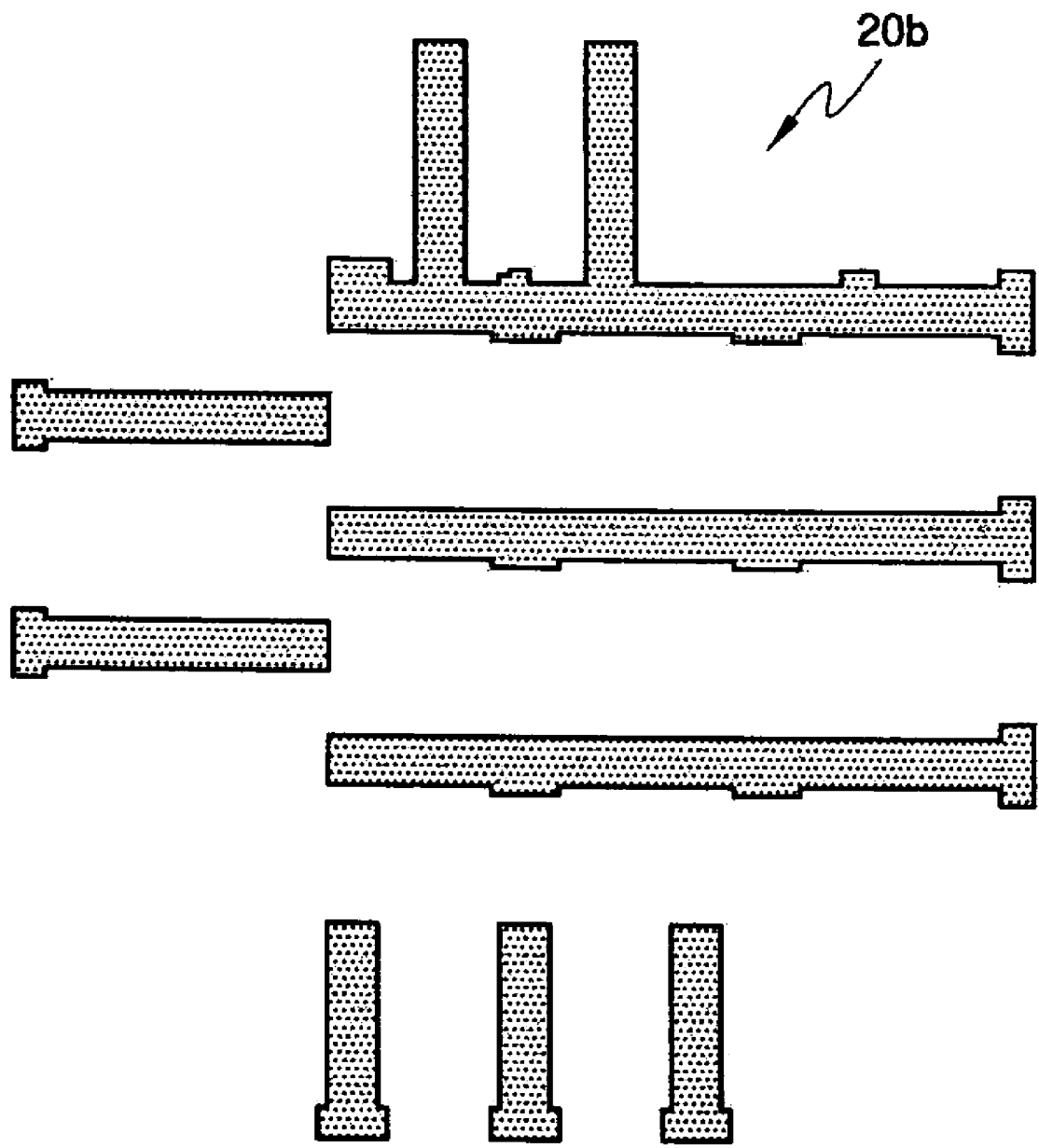

With reference to FIGS. 1 and 3F, Optical Proximity Correction (OPC) is performed on the modified second mask data pattern 20a and the third mask data patterns 40 and 50 at step S160. Second mask data pattern 20b, which is formed by performing the OPC on the modified second mask data pattern 20a, is shown in FIG. 3F.

A rule table-based correction method is a method of listing the amounts of correction depending on the arrangements of patterns in a rule table, and correcting the patterns of the mask data pattern with reference to the rule table. Although the correction method has a simple correction sequence, it may be complicated to list the entire range of variation in an actual mask data pattern in the table.

A model-based correction method is a method of correcting a mask data pattern to determine the shape that will be transferred onto a wafer based on pattern and wafer process conditions, and form a desired pattern on the wafer. That is, evaluation marks are formed on the edge of a mask data pattern to perform the OPC, and the edge is divided according to the evaluation marks. The intensity of light around the evaluation marks is calculated and the divided edge is moved, so that the mask data pattern is modified.

Thereafter, the second mask data pattern 20b, on which the OPC has been performed, is verified, and the OPC is repeated until there is no pattern to be corrected at step S165.

With reference to FIG. 1, an emulation pattern, which is determined from the second and third mask data patterns 20b, 40 and 50 on which the OPC has been performed, is created using an image-based SADP emulation. The image-based SADP emulation uses process conditions, such as pitches between patterns, the deposition thickness of a sacrificial layer, the deposition thickness of a hard mask layer, and exposure conditions, such as the wavelength, dosage and energy of light. The image-based SADP emulation uses the exposure conditions and the process conditions so that the actual pattern formed on the wafer can be formed using the second mask data pattern 20b and the third mask data patterns, on which the OPC has been performed.

Figure 3G:
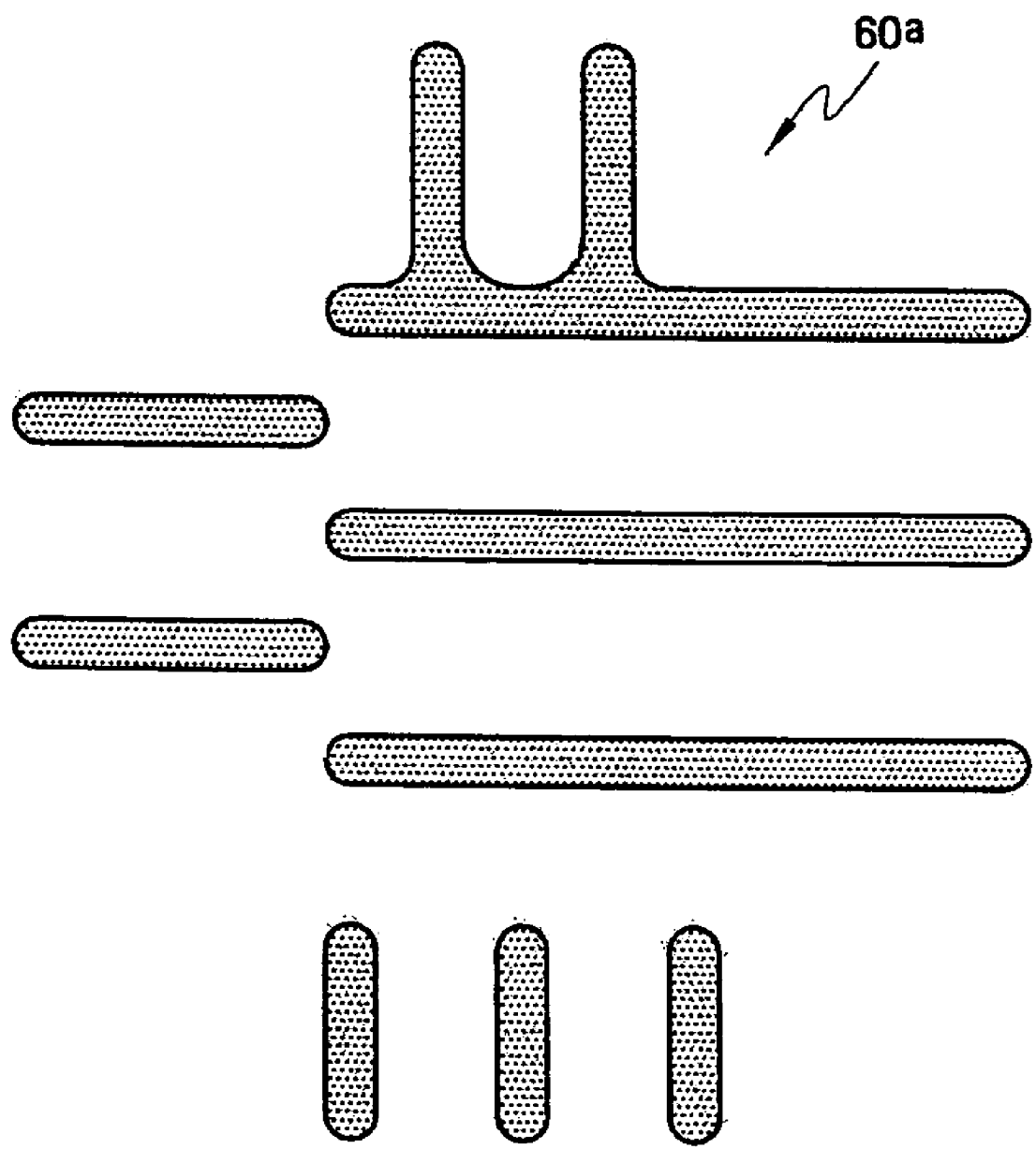
Figure 3H:
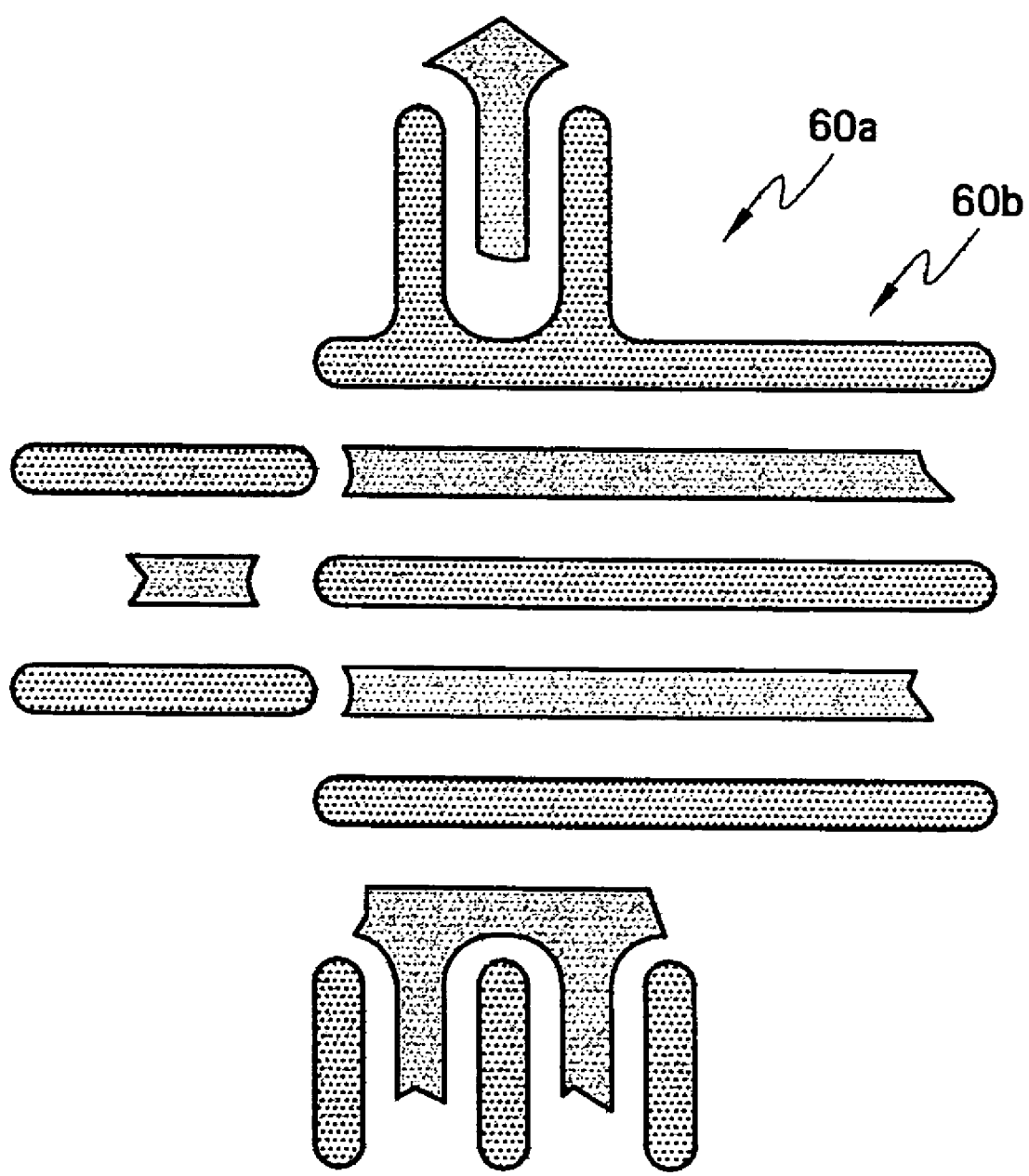

With reference to FIGS. 2, 3G and 3H, the image-based SADP emulation is described. FIG. 3G shows a second emulation pattern 60a, which is formed using the second mask data pattern 20b on which the OPC has been performed. FIG. 3H shows a pattern in which the second emulation pattern 60a, shown in FIG. 3G, and a third emulation pattern 60b, obtained from the second emulation pattern 60a, overlap.

The second emulation pattern (e.g., the one indicated by reference numeral 60a in FIG. 3G), which is determined from the second mask data pattern 20b on which the OPC has been performed, is created using a general emulation at step S410. Emulation tools that can be used include, for example, the Mentor's Calibre and Synopsys's Proteus. The term 'general emulation' refers to determination of the emulation pattern 60a that can be created from the second mask data pattern 20b, on which the OPC has been performed, using the process conditions and the exposure conditions.

Thereafter, the third emulation pattern 60b, which is determined from the second emulation pattern 60a, is created using the SADP emulation at step S420.

Parameters related to the step processes of an SADP process are defined at step S422. The step processes of the SADP process may be sequentially performed to form an etching target layer and a first hard mask layer pattern on a substrate (refer to FIGS. 8A and 8B), conformally form a sacrificial layer on the first hard mask pattern and an exposed etching target layer (refer to FIG. 8C), form a second hard mask layer on the sacrificial layer (refer to FIG. 8D), planarize the second hard mask layer and the sacrificial layer so that the upper surface of the first hard mask pattern is exposed (refer to FIG. 8E) and the sacrificial layer exposed between the first hard mask layer pattern and the planarized second mask layer is removed (refer to FIGS. 8F, 8G and 8H), and remove the etching target layer exposed by the first hard mask layer pattern and the planarized second hard mask layer (refer to FIG. 8I).

The parameters related to the step processes may include, for example, the deposition thickness of at least one layer formed through each of the step processes, or the degree of skew that occurs after each of the step processes is performed. The deposition thickness of at least one layer formed through each of the step processes may be exemplified by the deposition thickness of the first and/or second hard mask layer pattern, and the deposition thickness of the sacrificial layer. The skew that occurs after each of the step processes is performed may be exemplified by skew that occurs when the sacrificial layer and the etching target layer are removed using an etching process.

Thereafter, each of the step processes is modeled using the defined parameters at step S424. For example, the modeling method may perform addition, subtraction, multiplication and division on the parameters that are defined to reveal the representative feature of each of the step processes. To exhibit the detailed features of each of the step processes, modeling may be performed to sufficiently reflect variation in patterns after each process step is performed while considering the distances between patterns in the second emulation pattern 60a and the characteristics of process equipment as well as the defined parameters. Such a modeling method may be modified in various ways according to exemplary embodiments of the present invention.

Thereafter, each step process model, which is obtained through the modeling, is applied to the second emulation pattern (refer to reference numeral 60a (the dark dot pattern) of FIG. 3H). The third emulation pattern (refer to reference numeral 60b (the light dot pattern) of FIG. 3H) is thus created.

Figure 4:
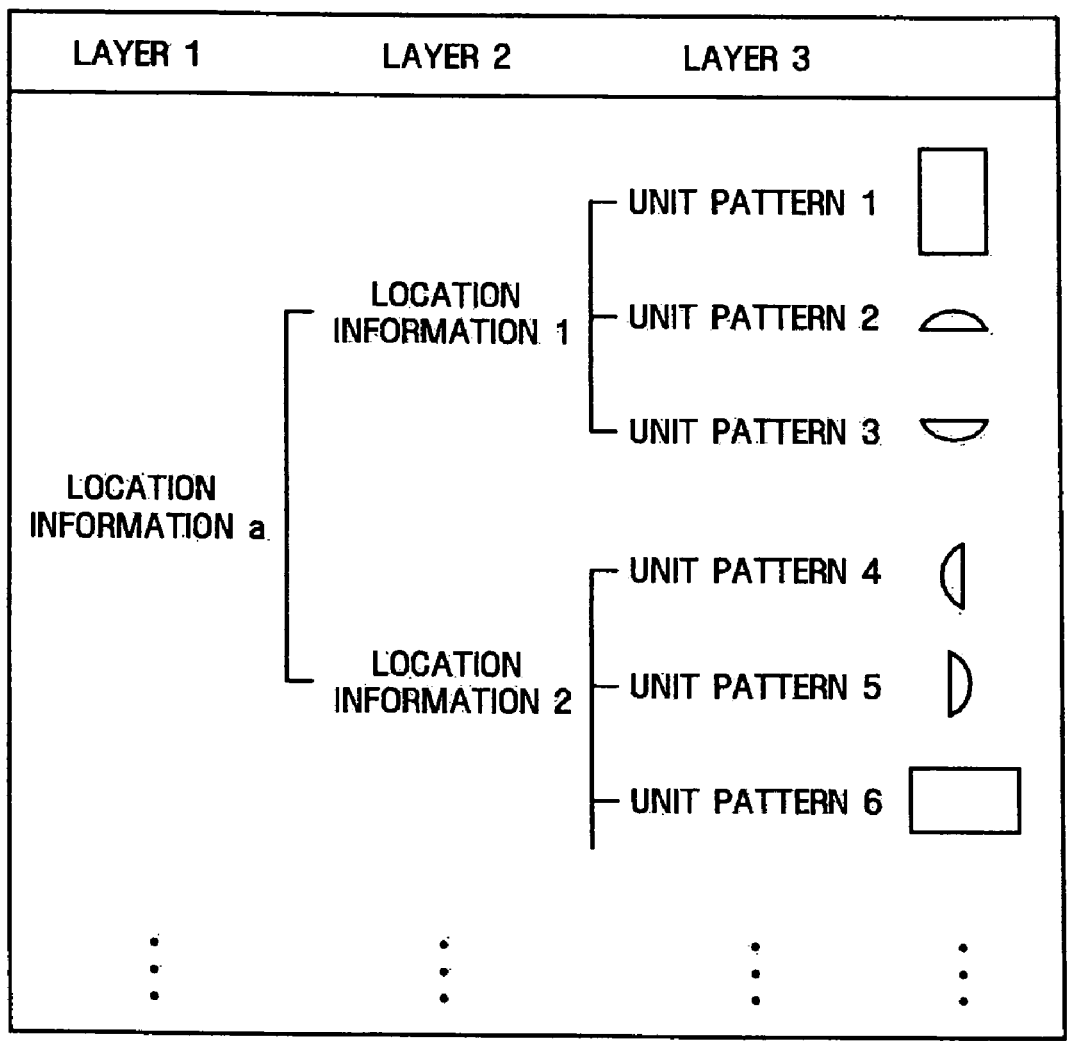
FIG. 4 is a diagram illustrating location information about unit patterns according to an exemplary embodiment of the present invention.

Each of the created second emulation pattern 60a and the third emulation pattern 60b may have a hierarchical structure. In the image-based SADP emulation, the detailed shapes of the patterns are determined by modeling the SADP process, so that the emulation patterns 60a and 60b created using the image-based SADP emulation may be complicated. Accordingly, when the respective shapes of the patterns are stored in a storage medium coupled to an emulation tool, the amount of data to be stored or processed may be considerable. Accordingly, as shown in FIG. 4, the lowest layer (for example, layer 3) stores unit patterns, and a higher layer (for example, layer 1 or 2) stores only location information, which indicates where the unit patterns in the emulation patterns are located, so that the amount of data can be reduced. For example, location information 1 in layer 2 is used to form a pattern using a combination of unit patterns 1, 2 and 3, and location information 'a' in layer 3 is used to determine where the pattern is disposed in the emulation patterns 60a and 60b.

Figure 3I:
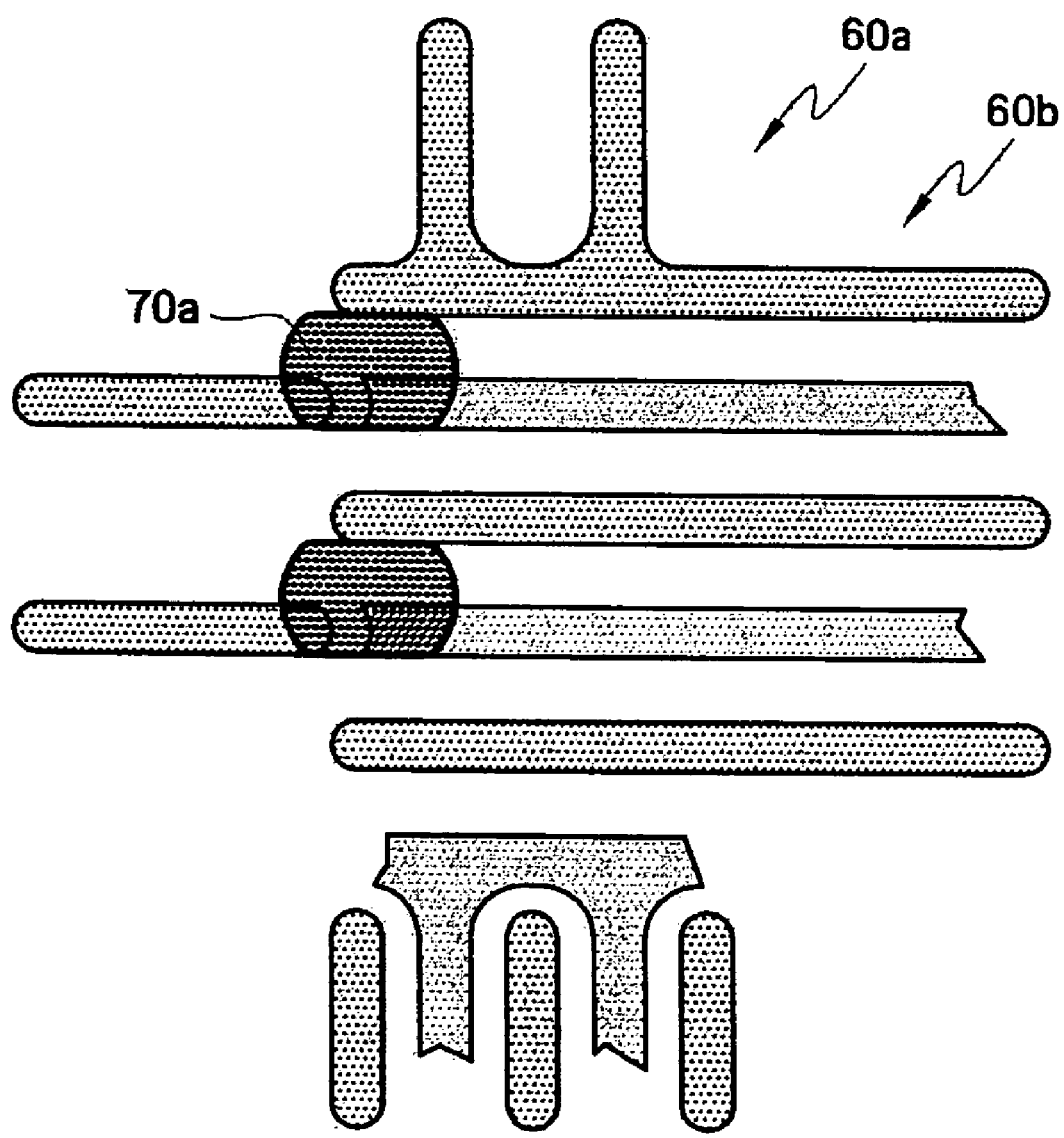
Figure 3J:
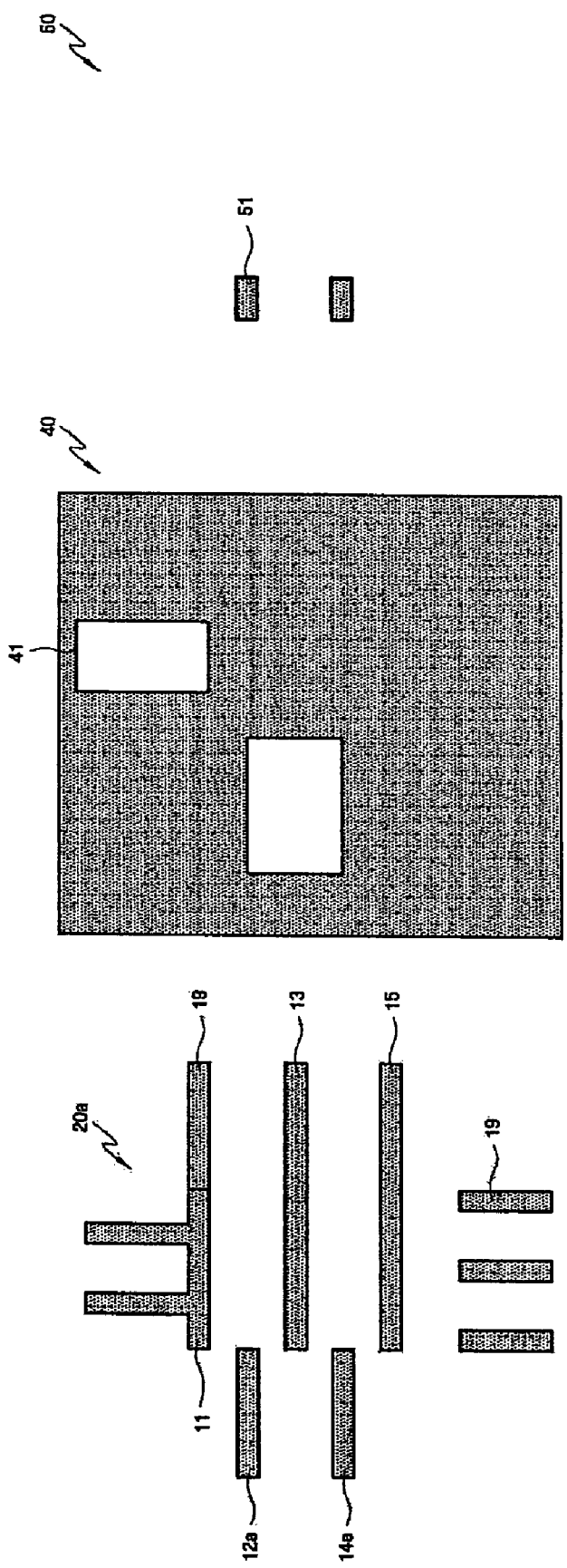
Figure 3K:
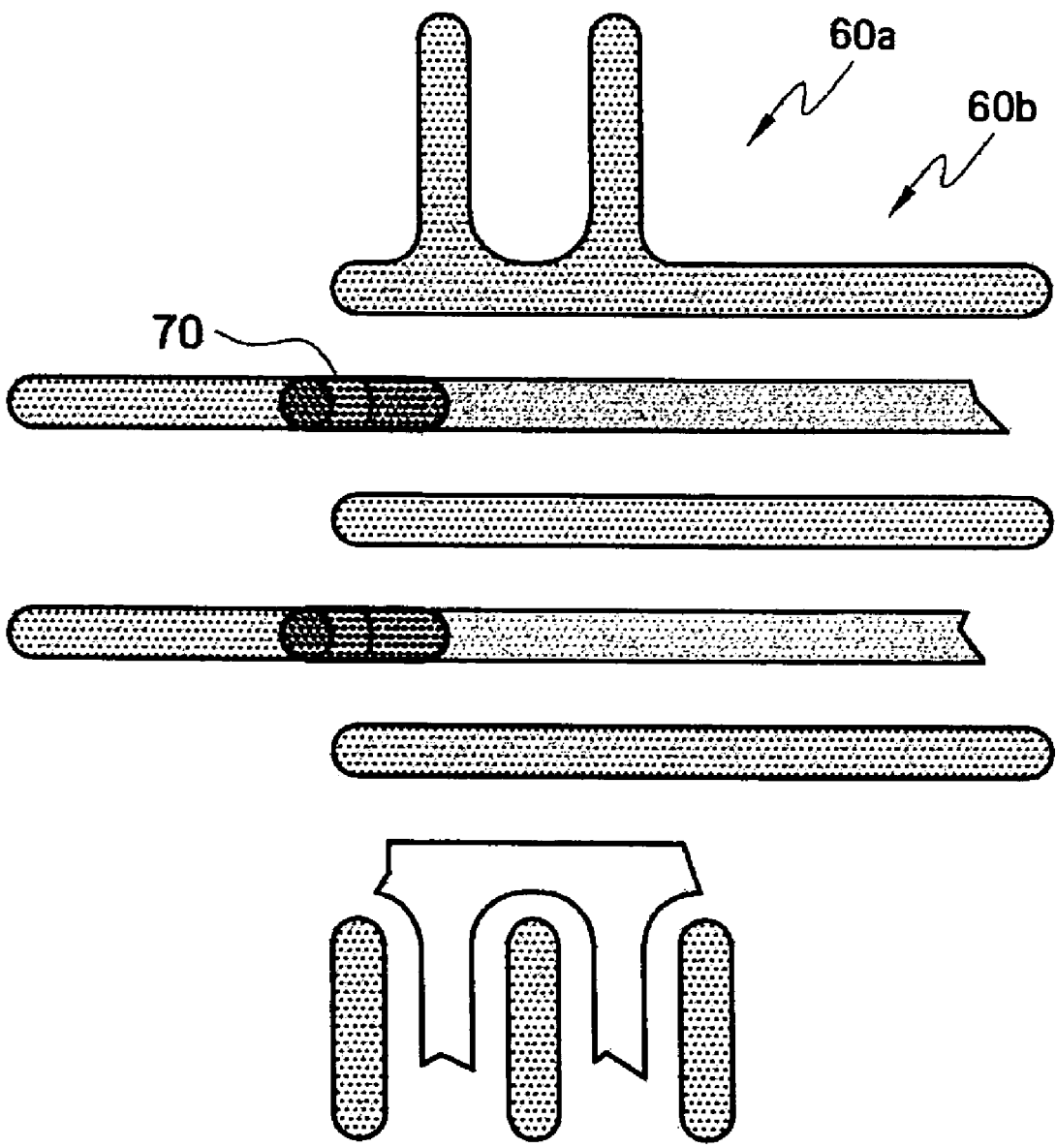

With reference to FIGS. 1, 3I and 3J, a pattern, in which the second to fourth emulation patterns 60a, 60b and 70a overlap, and the first mask data pattern 10 are compared with each other at step S180. The second and third emulation patterns 60a and 60b are obtained from the second mask data pattern 20b, on which the OPC has been performed, and the fourth emulation pattern 70a is obtained from the third mask data pattern on which the OPC has been performed.

Depending on the differences between the second to fourth emulation patterns 60a, 60b and 70a and the first mask data pattern 10, subsequent steps to be performed are changed. That is, the first mask data pattern 10 may be redesigned at step S110 if it is determined that the mask data pattern 10 has erroneously designed at a prior stage. The second mask data pattern 20 may be redesigned at step S120 if it is determined that the second mask data pattern 20 has been erroneously designed at a prior stage. The third mask data patterns 40 and 50 may be redesigned at step S150 if it is determined that the third mask data patterns 40 and 50 have been erroneously designed at a prior stage. If it is determined that it is not necessary to redesign the first to third mask data patterns 10, 20, 40 and 50, the first to third mask data patterns 10, 20, 40 and 50 may be partially modified.

FIG. 3I shows the second and third emulation patterns 60a and 60b and the fourth emulation pattern 70a overlapping each other. With reference to FIG. 3I, it can be seen that a bridge is created between the second and third emulation patterns 60a and 60b by the fourth emulation pattern 70a. To remove such a bridge, the third mask data patterns 50, including the connection patterns (e.g., those indicated by reference numeral 51a in FIG. 3E) may be modified. The modified third mask data patterns 50 are shown in FIG. 3J. The connection patterns 51 of FIG. 3J are reduced in size compared to the connection patterns 51a of FIG. 3E.

In an exemplary embodiment, the pattern, in which the second to fourth emulation patterns 60a, 60b and 70a overlap, and the first mask data pattern 10 may be compared with each other, and conflict points may be found. The conflict points may include, for example, the case where a notch occurs, the case where a bridge occurs, and the case where variation in Critical Dimension (CD) occurs, according to a classification reference. Such a classification reference may be modified according to exemplary embodiments of the present invention.

Thereafter, OPC is performed on the newly modified third-mask data pattern 50 at step S160. Verification is performed at step S165. The image-based SADP emulation is performed on the second mask data pattern 20b and the third mask data patter, on which the OPC has been performed, at step 170. Comparison is performed at step S180.

Thereafter, as a result of the image-based SADP emulation, if it is determined that the second mask data pattern 20b and the third mask data patterns, on which the OPC has been performed, have been normally manufactured, the first and second mask layers are manufactured at step S190. The first and second mask layers respectively correspond to the second mask data pattern 20b and the third mask data patterns, on which the OPC has been performed.

Figure 5:
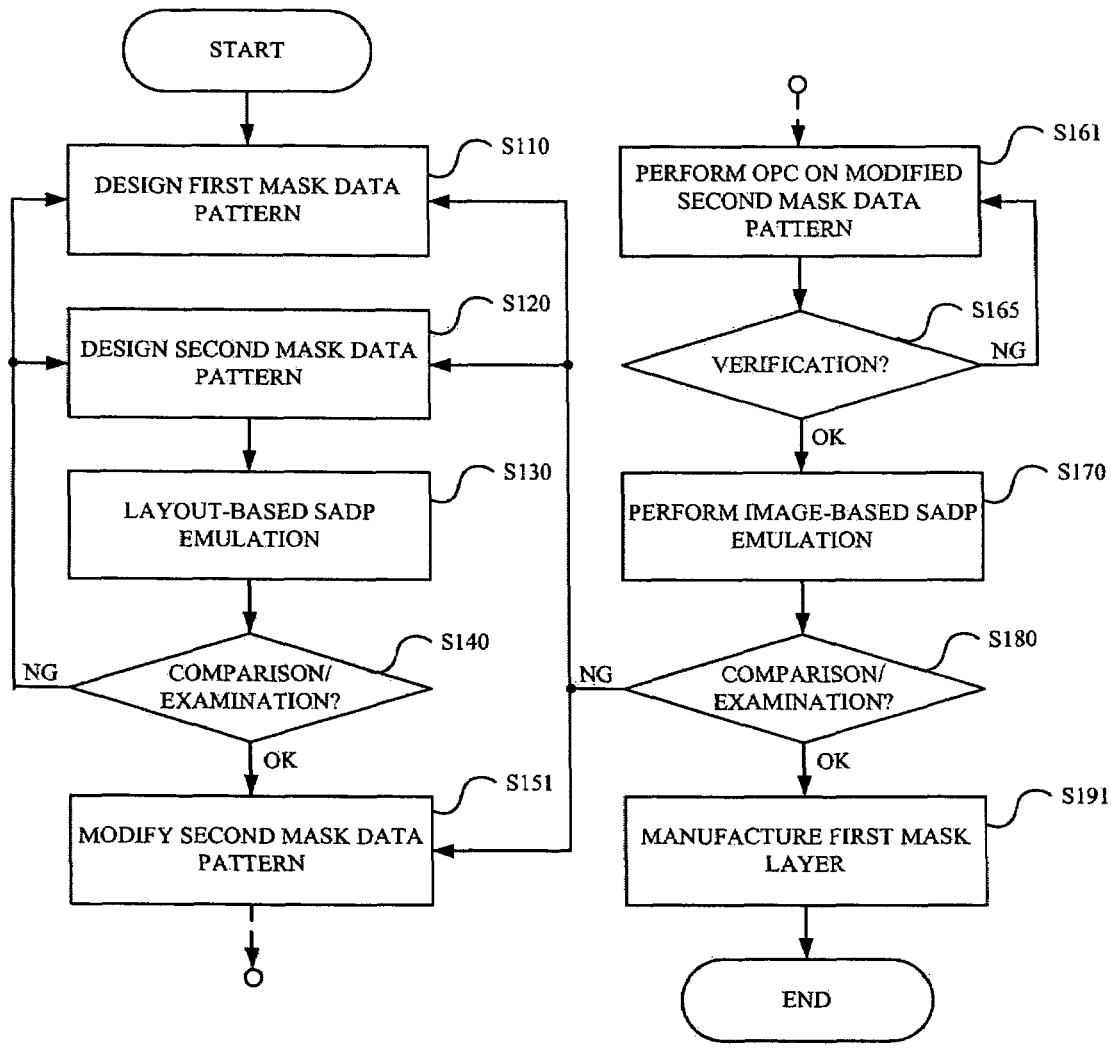
FIG. 5 is a flowchart for illustrating a method of manufacturing a mask according to an exemplary embodiment of the present invention.

FIG. 5 is a flowchart illustrating a method of manufacturing a mask according to an exemplary embodiment of the present invention.

With reference to FIG. 5, a method of manufacturing a mask according to this exemplary embodiment of the present invention differs from the exemplary embodiment shown in FIG. 1 in that, after the comparison between the first emulation pattern and the first mask data pattern, the separate third mask data patterns are not redesigned but only the second mask data pattern is modified at step S151. Accordingly, the OPC is performed only on the modified second mask data pattern at step 161, and then a first mask layer, which corresponds to the second mask data pattern, on which the OPC has been performed, is manufactured at step S191.

Figure 6:
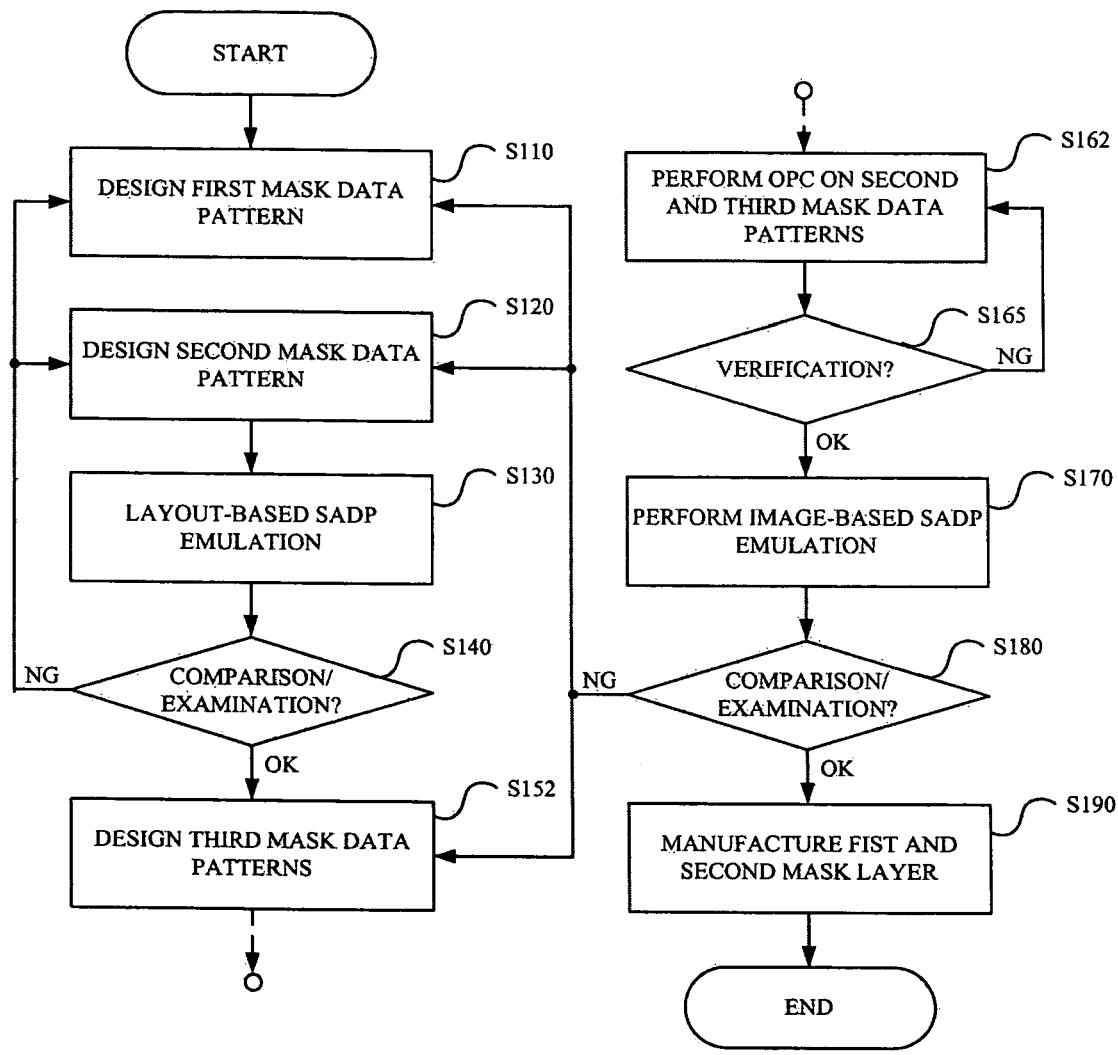
FIG. 6 is a flowchart for illustrating a method of manufacturing a mask according to an exemplary embodiment of the present invention.

FIG. 6 is a flowchart for illustrating a method of manufacturing a mask according to an exemplary embodiment of the present invention.

With reference to FIG. 6, the method of manufacturing a mask according to the this exemplary embodiment of the present invention differs from the exemplary embodiment shown in FIG. 1 in that, after the comparison between the first emulation pattern 10 and the first mask data pattern, the second mask data patterns are not modified but only the separate third mask data patterns are newly designed at step S152. Accordingly, the OPC is performed on the second and third mask data patterns at step S162.

Figure 7:
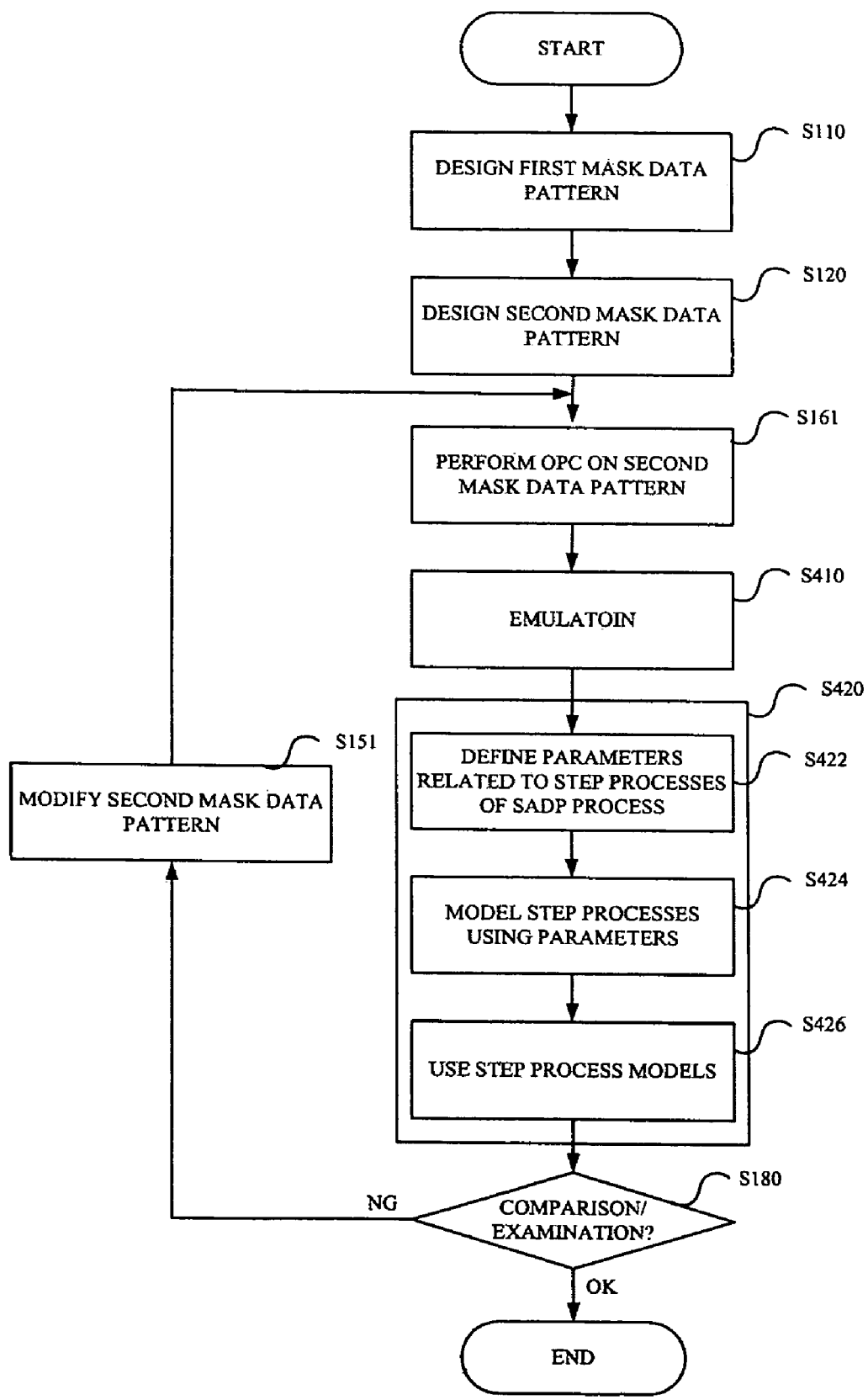
FIG. 7 is a flowchart for illustrating a method of manufacturing a mask according to an exemplary embodiment of the present invention.

FIG. 7 is a flowchart illustrating a method of manufacturing a mask according to an exemplary embodiment of the present invention.

With reference to FIG. 7, the method of manufacturing a mask according to the this exemplary embodiment of the present invention differs from the method of the exemplary embodiment shown in FIG. 1 in that the layout-based SADP emulation is not performed, but only the image-based SADP emulation is performed. In an exemplary embodiment of the present invention, the second mask data pattern may be modified, and separate third mask data patterns may be newly designed as a result of the comparison at step S426, as shown in FIG. 1. Furthermore, as a result of the comparison at step 426, only separate third mask data patterns may be newly designed, as shown in FIG. 6.

With reference to FIGS. 8A to 8I, an SADP process is described according to an exemplary embodiment of the present invention.

Figure 8A:
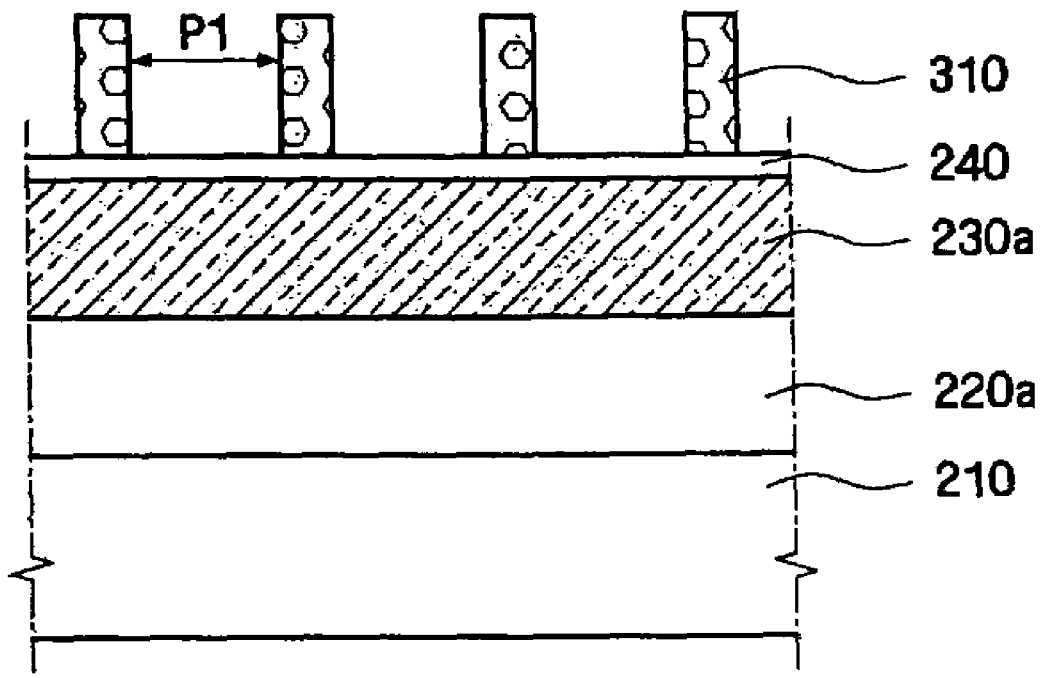
FIGS. 8A to 8I are diagrams illustrating an SADP process performed using first and second mask layers manufactured according to an exemplary embodiment of the present invention.

With reference to FIG. 8A, an etching target layer 220a, a first hard mask layer 230a, an anti-reflective film 240, and a first photoresist film pattern 310 are sequentially layered on a substrate 210. The etching target layer 220a is a layer that is to be etched, and may be a conductive layer for forming, for example, gate electrodes, bitlines, capacitor or storage nodes, or may be an insulation layer, such as an oxide layer or a nitride layer, in which contact holes are formed. The first hard mask layer 230a is formed of a layer having a high etching selectivity for the etching target layer 220a. When the etching target layer 220a is an insulation layer, the first hard mask layer 230a may be a polysilicon oxide layer. In an exemplary embodiment, the first photoresist film pattern 310 is formed using the first mask layer, which corresponds to the corrected second mask data pattern 20b. Accordingly, the values of pitches between the patterns of the first photoresist film pattern 310 may be equal to the first pitch P1.

Figure 8B:
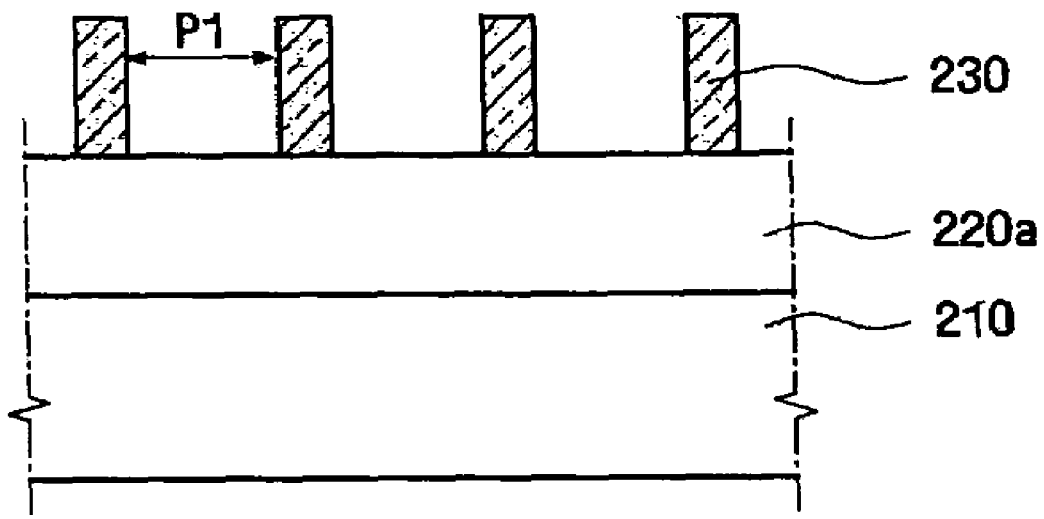

With reference to FIG. 8B, a first hard mask layer 230a exposed by the first photoresist film pattern 310 is patterned. Thus, a first hard mask layer pattern 230 having the first pitch P1 is formed. Thereafter, the first photoresist film pattern 310 is removed through an ashing/strip process.

Figure 8C:
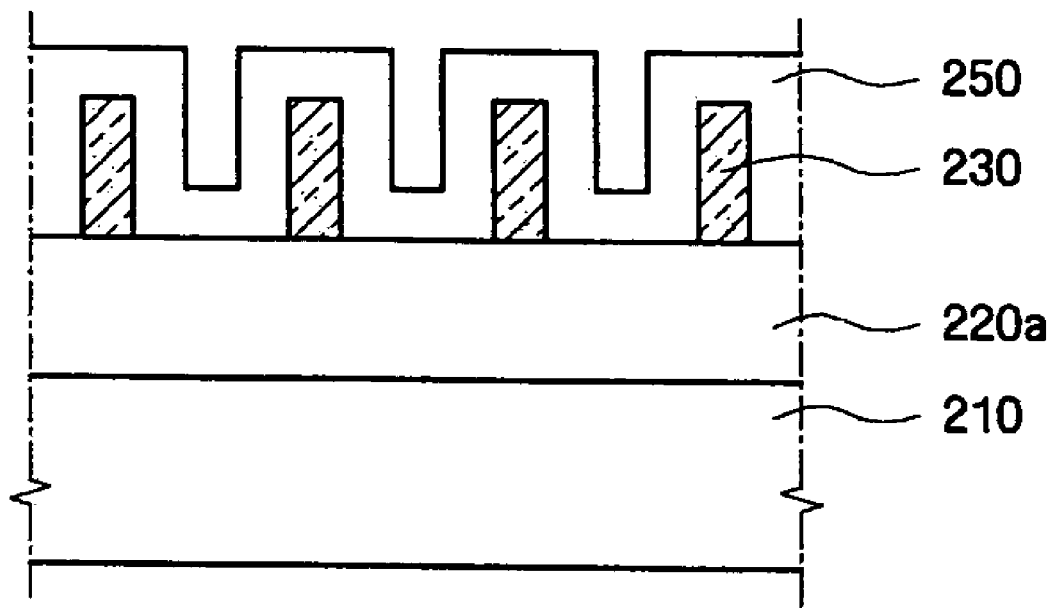

With reference to FIG. 8C, a sacrificial layer 250 is formed on the first hard mask layer pattern 230 and the exposed etching target layer 220a on the substrate 210 to a predetermined thickness. The sacrificial layer 250 has good step coverage to be conformally layered along the first hard mask layer pattern 230 and the exposed etching target layer 220a on the substrate 210. The sacrificial layer 250 may comprise a material having a high etching selectivity for the first hard mask layer pattern 230. A silicon oxide layer may be used as the sacrificial layer 250. Examples of the silicon oxide layer may include a Middle Temperature Oxide (MTO) layer, Undoped Silica Glass (USG), an $O_3$-Tetra Ethyl Ortho Silicate ($O_3$-TEOS) layer, and a High Density Plasma (HDP) layer. The silicon oxide layer may be formed using, for example, a thermal oxidation process or a Chemical Vapor Deposition (CVD) process. In an exemplary embodiment, the sacrificial layer 250 may have a thickness corresponding to about ⅓ of the first pitch P1.

Figure 8D:
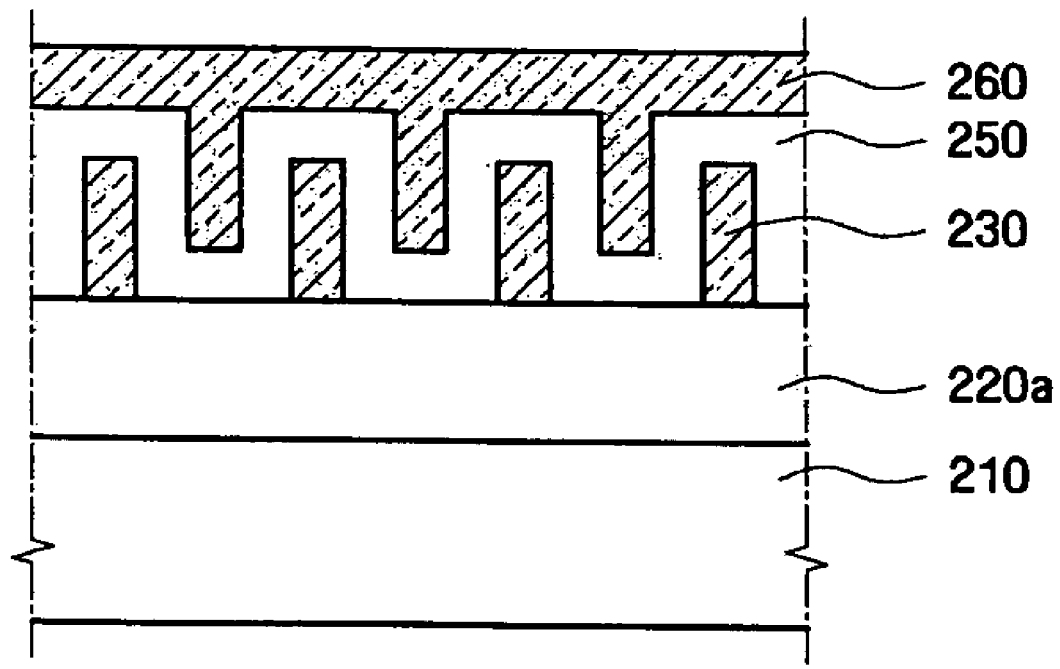

With reference to FIG. 8D, a second hard mask layer 260 is formed on the sacrificial layer 250. The second hard mask layer 260 can have a high etching selectivity for the sacrificial layer 250, and may comprise the same material as the first hard mask layer pattern 230.

Figure 8E:
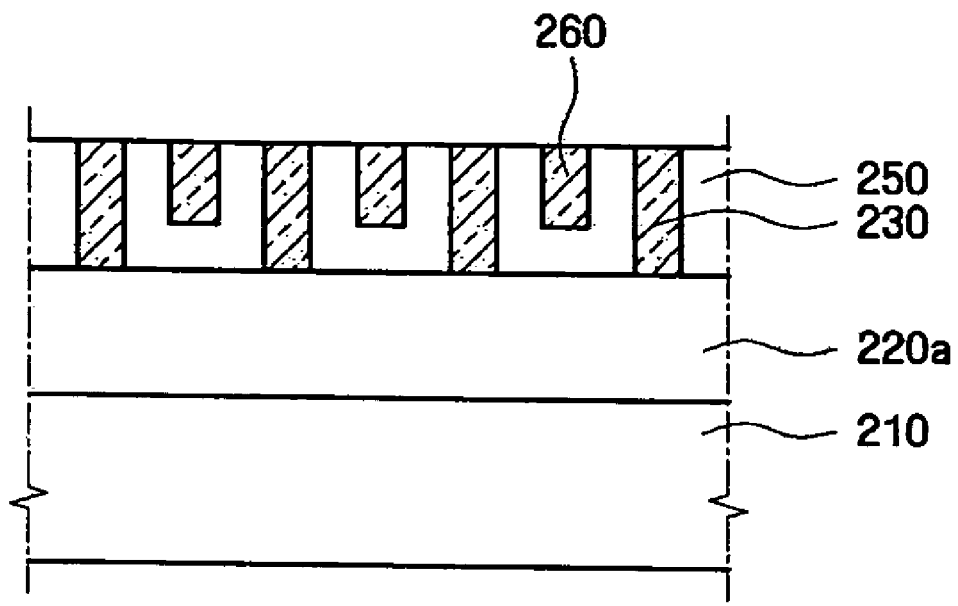

With reference to FIG. 8E, the second hard mask layer 260 and the sacrificial layer 250 are partially planarized to expose the upper surface of the first hard mask layer pattern 230. The planarization process may be performed using a Chemical Mechanical Polishing (CMP) process or an etch-back process.

Figure 8F:
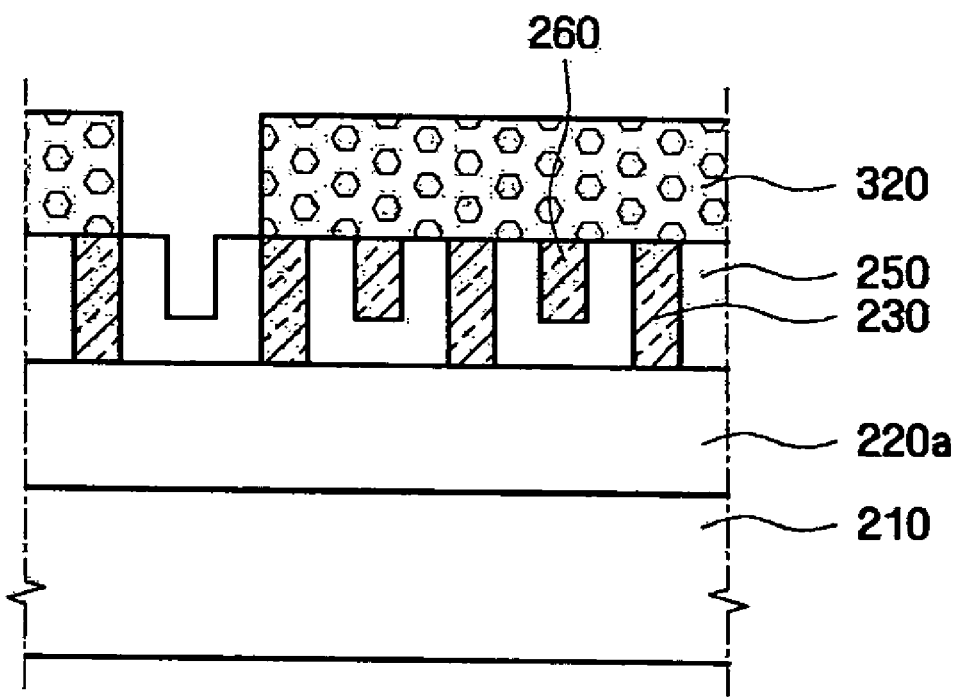

With reference to FIG. 8F, a second photoresist film pattern 320 is formed on the resultant product, and the second hard mask layer 260 exposed by the second photoresist film pattern 320 is removed using, for example, wet etching. In an exemplary embodiment, the second photoresist film pattern 320 is formed using the second mask layer, which corresponds to the third mask data pattern, on which the OPC has been performed, including trimming patterns. Thereafter, the second photoresist film pattern 320 is removed through an ashing process and/or a strip process.

Figure 8G:
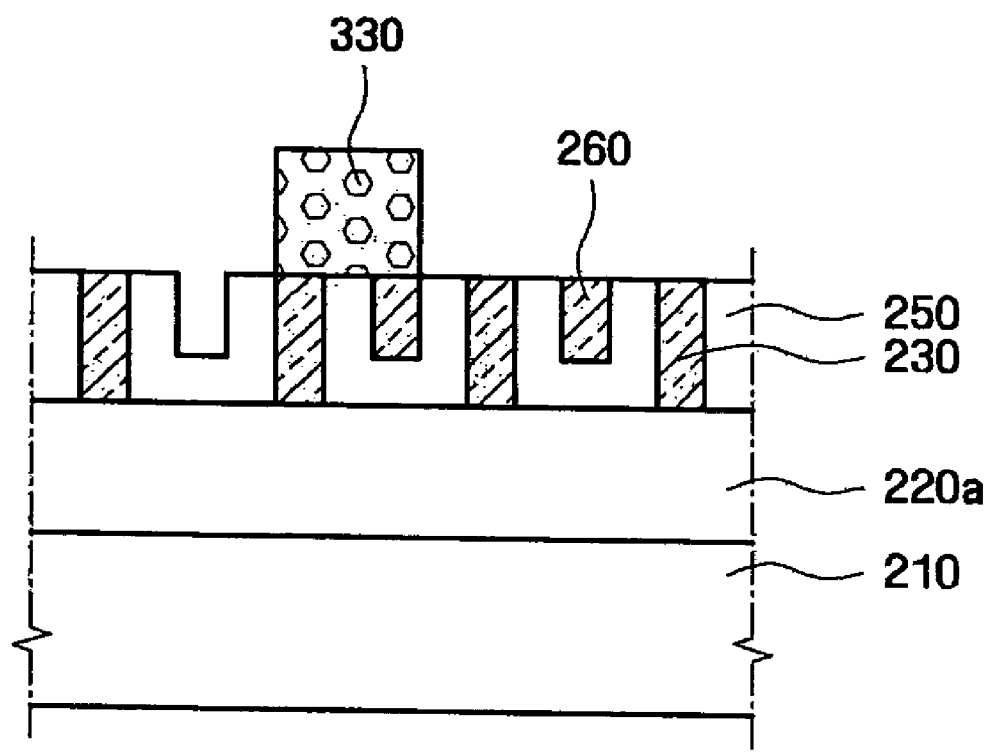

With reference to FIG. 8G, a third photoresist film pattern 330 is formed on the resultant product In an exemplary embodiment, the third photoresist film pattern 330 may be formed using the second mask layer. The second mask layer corresponds to the third mask data pattern, on which the OPC has been performed, including connection patterns.

Figure 8H:
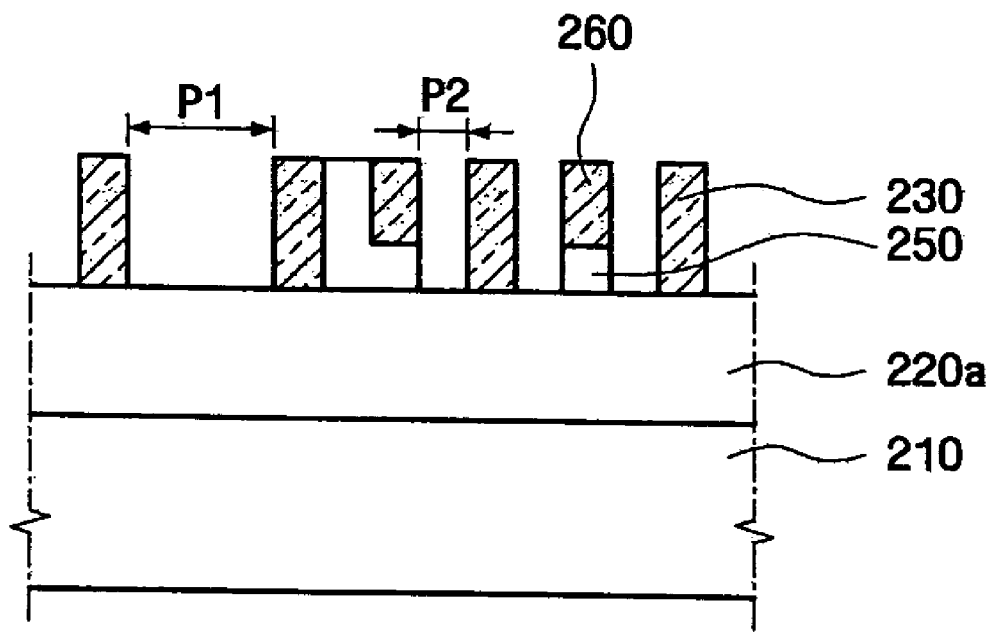

With reference to FIG. 8H, the sacrificial layer 250 exposed by the third photoresist film pattern 330 is removed using anisotropic etching, for example, a dry etching process or a reactive ion etching process. Accordingly, the first and second hard mask layers 230 and 260, formed using an anisotropic etching, have the first pitch P1, and the second pitch P2 less than the first pitch P1.

Figure 8I:
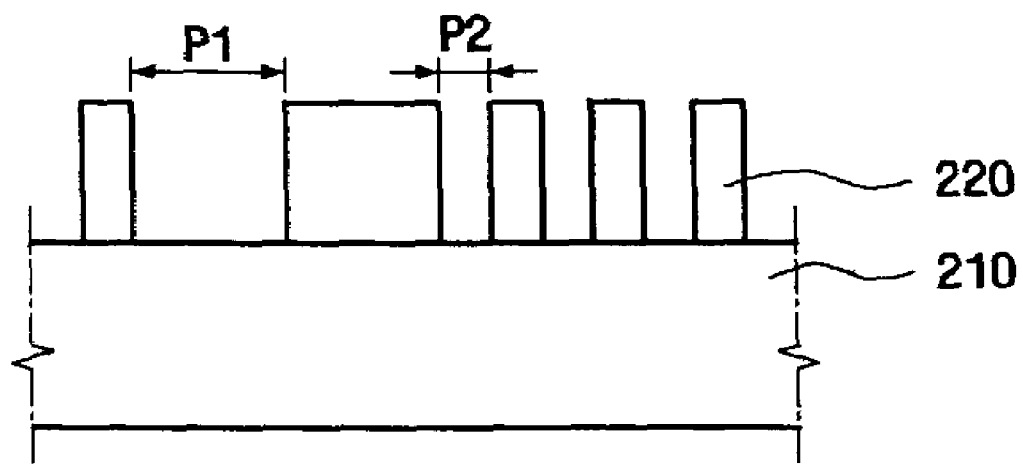

With reference to FIG. 8I, the etching target layer 220a exposed by the first and second hard mask layers 230 and 260 is etched using an anisotropic etching. The hard mask layers 230 and 260 can be formed using an anisotropic etching. Thus the etching target layer pattern 220 is completed. The etching target layer pattern 220 has the first pitch P1, and the second pitch P2 less than the first pitch.

In accordance with a method of manufacturing a mask according to an exemplary embodiment of the present invention, the mask data pattern for performing an SADP process having high reliability can be formed using the layout-based SADP emulation and the image-based SADP emulation.

Although exemplary embodiments have been described with reference to the accompanying drawings, it is to be understood that the present invention is not limited to these precise embodiments but various changes and modifications can be made by one skilled in the art without departing from the spirit and scope of the present invention. All such changes and modifications are intended to be included within the scope of the invention as defined by the appended claims.

What is claimed is:

1. A method of manufacturing a mask, the method comprising:
designing a second mask data pattern for forming a first mask data pattern;
creating a first emulation pattern, which is determined from the second mask data pattern, using a first emulation;
creating a second emulation pattern, which is determined from the first emulation pattern, using a second emulation;
comparing a pattern, in which the first and second emulation patterns overlap, with the first mask data pattern; and
manufacturing a mask layer, which corresponds to the second mask data pattern, according to results of the comparison.

2. The method of claim 1, wherein the first emulation and the second emulation comprise a general emulation and a self-aligning double patterning (SADP) emulation, respectively.

3. The method of claim 2, wherein creating the second emulation pattern comprises:
defining one or more parameters related to respective step processes of an SADP process;
modeling each of the step processes using the one or more parameters; and
creating the second emulation pattern by applying step process models to the first emulation pattern.

4. The method of claim 3, wherein the step processes of the SADP process comprises:
forming an etching target layer and a first hard mask layer pattern on a substrate;
conformally forming a sacrificial layer on the first hard mask layer pattern and an exposed etching target layer;
forming a second hard mask layer on the sacrificial layer;
planarizing the second hard mask layer and the sacrificial layer so that an upper surface of the first hard mask layer pattern is exposed;
removing the sacrificial layer exposed between the first hard mask layer pattern and the planarized second hard mask layer; and
removing the etching target layer exposed between the first hard mask layer pattern and the planarized second hard mask layer.

5. The method of claim 3, wherein the one or more parameters comprise a deposition thickness of at least one layer formed through each of the step processes, and a degree of skew that occurs after performing each of the step processes.

6. The method of claim 1, wherein comparing the pattern, in which the first and second emulation patterns overlap, with the first mask data pattern comprises:
finding conflict points at which the pattern, in which the first and second emulation patterns overlap, and the first mask data pattern do not match with each other; and
classifying the conflict points.

7. The method of claim 1, further comprising:
comparing the pattern, in which the first and second emulation patterns overlap, with the first mask data pattern; and
modifying the second mask data pattern according to the results of the comparison.

8. The method of claim 1, further comprising:
comparing the pattern, in which the first and second emulation patterns overlap, with the first mask data pattern; and designing third mask data patterns, which are used to create partial patterns that are not formed using the second mask data pattern, according to the results of the comparison.

9. The method of claim 8, wherein each of the third mask data patterns comprises at least one of trimming patterns, connection patterns, or dummy patterns.

10. The method of claim 1, further comprising creating a third emulation pattern, which is determined from the second mask data pattern, using a layout-based self-aligning double patterning (SADP) emulation.

11. The method of claim 10, further comprising:
comparing the third emulation pattern with the first mask data pattern; and
modifying the second mask data pattern according to the results of the comparison.

12. The method of claim 10, further comprising:
comparing the third emulation pattern with the first mask data pattern; and
designing the third mask data patterns, which are used to create the partial patterns that are not formed using the second mask data pattern, according to the results of the comparison.

13. The method of claim 12, wherein each of the third mask data patterns comprises at least one of trimming patterns, connection patterns, or dummy patterns.

14. The method of claim 1, further comprising, before performing the first emulation, performing Optical Proximity Correction (OPC) on the second mask data pattern.

15. The method of claim 1, wherein the first emulation pattern and/or the second emulation pattern have a hierarchical structure.

16. A method of manufacturing a mask, the method comprising:
designing a first mask data pattern;
designing a second mask data pattern for forming the first mask data pattern;
creating a first emulation pattern, which is determined from the second mask data pattern, using a layout-based self-aligning double patterning (SADP) emulation;
comparing the first emulation pattern with the first mask data pattern;
modifying the second mask data pattern according to results of the comparison;
performing an Optical Proximity Correction (OPC) on the modified second mask data pattern;
creating a second emulation pattern, which is determined from the second mask data pattern, on which the OPC has been performed, using a general emulation;
creating a third emulation pattern, which is determined from the second emulation pattern, using an SADP emulation;
comparing a pattern, in which the second and third emulation patterns overlap, with the first mask data pattern; and
manufacturing a first mask layer, which corresponds to the second mask data pattern, according to results of the comparison.

17. The method of claim 16, wherein creating the third emulation pattern comprises:
defining one or more parameters related to each of step processes of an SADP process;
modeling each of the step processes using the parameters; and
creating the third emulation pattern by applying step process models to the second emulation pattern.

18. The method of claim 16, further comprising:
comparing the pattern, which is obtained through overlapping, with the first mask data pattern;
and modifying the second mask data pattern according to the results of the comparison.

19. The method of claim 16, further comprising:
comparing the pattern, which is obtained through overlapping, with the first mask data pattern;
and designing third mask data patterns, which are used to create partial patterns that are not formed using the second mask data pattern, according to results of the comparison.

20. The method of claim 16, wherein the comparing the first emulation pattern with the first mask data pattern and modifying the second mask data pattern according to the results of the comparison comprises:
modifying the second mask data pattern; and
designing third mask data patterns for creating partial patterns that are not forming using the second mask data pattern.

21. A method of manufacturing a mask, the method comprising:
designing a first mask data pattern;
designing a second mask data pattern for forming the first mask data pattern;
creating a first emulation pattern, which is determined from the second mask data pattern, using a layout-based self-aligning double patterning (SADP) emulation;
comparing the first emulation pattern with the first mask data pattern;
designing third mask data patterns, which are used to create partial patterns that are not formed using the second mask data pattern, according to results of the comparison;
performing an Optical Proximity Correction (OPC) on the second and third mask data patterns;
creating a second emulation pattern, which is determined from the second mask data pattern on which the OPC has been performed, using a general emulation;
creating a third emulation pattern, which is determined from the second emulation pattern, using an SADP emulation;
creating a fourth emulation pattern, which is determined from the third mask data patterns on which the OPC has been performed, using the general emulation;
comparing a pattern, in which the second to fourth emulation patterns overlap, with the first mask data pattern; and
manufacturing first and second mask layers, which respectively correspond to the second and third mask data patterns, according to results of the comparison.

22. The method of claim 21, wherein creating the third emulation pattern comprises:
defining one or more parameters related to each of step processes of an SADP process;
modeling each of the step processes using the parameters; and
creating the third emulation pattern by applying step process models to the second emulation pattern.

23. The method of claim 22, wherein the step processes of the SADP process comprise:
forming an etching target layer and a first hard mask layer pattern on a substrate;
conformally forming a sacrificial layer on the first hard mask layer pattern and an exposed etching target layer;
forming a second hard mask layer on the sacrificial layer;

planarizing the second hard mask layer and the sacrificial layer so that an upper surface of the first hard mask layer pattern is exposed;

removing the sacrificial layer exposed between the first hard mask layer pattern and the planarized second hard mask layer; and removing etching target layer exposed between the first hard mask layer pattern and the planarized second hard mask layer.

24. The method of claim 22, wherein the parameters include a deposition thickness of at least one layer formed through each of the step processes, and a degree of skew that occurs after performing each of the step processes.

25. The method of claim 21, wherein comparing the pattern, which is obtained through overlapping, with the first mask data pattern comprises:

finding conflict points at which the pattern, which is obtained through overlapping, and the first mask data pattern do not match each other; and classifying the conflict points.

26. The method of claim 21, further comprising:

comparing the pattern, which is obtained through overlapping, with the first mask data pattern; and modifying the second and third mask data patterns according to the results of the comparison.

27. The method of claim 21, wherein comparing the first emulation pattern with the first mask data pattern and designing the third mask data patterns comprises:

modifying the second mask data pattern; and designing the third mask data patterns for creating partial patterns that are not formed using the second mask data pattern.

28. The method of claim 21, wherein at least one of the first to third emulation patterns has a hierarchical structure.

29. A method of manufacturing a mask, the method comprising:

defining one or more parameters related to respective step processes of a self-aligning double patterning (SADP) process;

modeling each of the step processes using the parameters; and creating a second emulation pattern by applying step process models to a first emulation pattern.

30. The method of claim 29, wherein the step processes of the SADP process comprise:

forming an etching target layer and a first hard mask layer pattern on a substrate;

conformally forming a sacrificial layer on the first hard mask layer pattern and an exposed etching target layer;

forming a second hard mask layer on the sacrificial layer;

planarizing the second hard mask layer and the sacrificial layer so that an upper surface of the first hard mask layer pattern is exposed;

removing the sacrificial layer exposed between the first hard mask layer pattern and the planarized second hard mask layer; and removing the etching target layer exposed between the first hard mask layer pattern and the planarized second hard mask layer.

31. The method of claim 29, wherein the parameters include a deposition thickness of at least one layer formed through each of the step processes, or a degree of skew that occurs after performing each of the step processes.

32. The method of claim 29, wherein the first emulation pattern and/or the second emulation pattern have a hierarchical structure.

* * * * *